United States Patent [19]

Carver et al.

[11] Patent Number: 5,067,985

[45] Date of Patent: Nov. 26, 1991

[54] BACK-CONTACT VERTICAL-JUNCTION SOLAR CELL AND METHOD

[75] Inventors: Michael W. Carver, Niceville, Fla.; Edward S. Kolesar, Jr., Beavercreek, Ohio

[73] Assignee: The United States of America as represented by the Secretary of the Air Force, Washington, D.C.

[21] Appl. No.: 534,981

[22] Filed: Jun. 8, 1990

[51] Int. Cl.⁵ .................... H01L 31/068; H01L 31/18
[52] U.S. Cl. .................... 136/255; 136/256; 357/30; 357/55; 156/647; 437/2
[58] Field of Search .................... 136/255, 256; 437/2; 357/30 J, 55; 156/647

[56] References Cited

U.S. PATENT DOCUMENTS

| | | | |
|---|---|---|---|
| 3,690,953 | 9/1970 | Wise | 136/255 |
| 4,101,351 | 7/1978 | Shah et al. | 437/2 |
| 4,409,423 | 10/1983 | Holt | 135/255 |
| 4,420,650 | 12/1983 | Wise et al. | 136/255 |
| 4,427,839 | 1/1984 | Hall | 135/255 |
| 4,478,879 | 10/1984 | Baraona et al. | 437/2 |

FOREIGN PATENT DOCUMENTS 52-57792  12/1977  Japan .................... 136/255

OTHER PUBLICATIONS

W.W. Lloyd, Conference Record, 11th IEEE Photovoltaic Specialists Conference, (1975) pp. 349–355.

Primary Examiner—Aaron Weisstuch
Attorney, Agent, or Firm—Gerald B. Hollins; Donald J. Singer

[57] ABSTRACT

An interdigitated back-contact vertical-junction solar cell which utilizes an anisotropically etched 110-oriented silicon crystal wafer. The cell structure includes rounded corner top edges of the between cell channel walls in order to improve light capturing ability and also has pn-junctions disposed over all of the cavity internal surfaces. Additional pn-junctions are located on the rear surface of the cell array to assist in generated carrier collection into a rear mounted metallic conductor grid. The disclosed cell has desirable transducer efficiency, without the use of anti-reflection coatings, and previous improved physical robustness, and radiation hardening. Fabrication of the cell array includes an isotropic etch of the cell dividers and the anisotropic etching to form cell cavities.

32 Claims, 11 Drawing Sheets

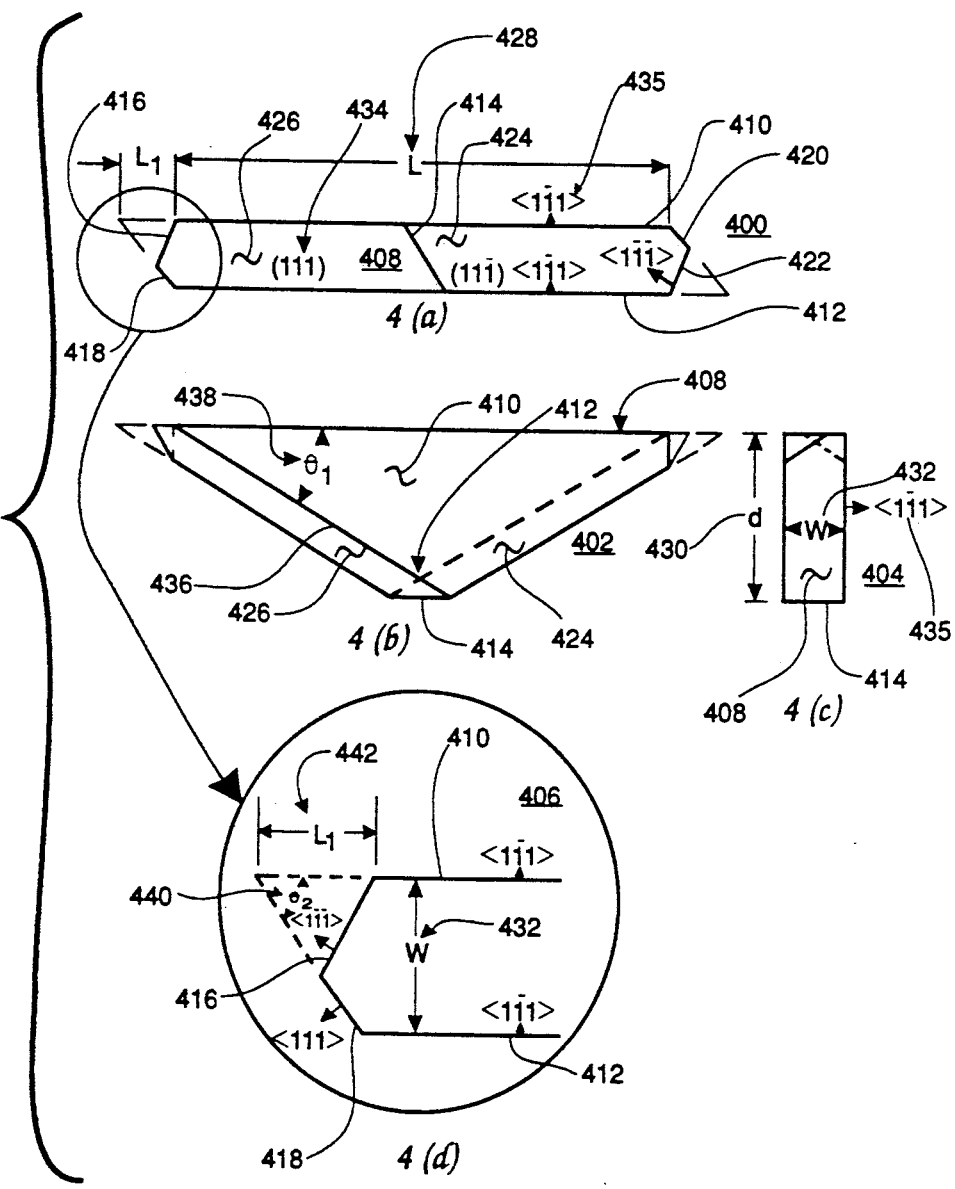

BACK-CONTACT VERTICAL-JUNCTION SOLAR CELL AND METHOD

RIGHTS OF THE GOVERNMENT

The invention described herein may be manufactured and used by or for the government of the United States for all governmental purposes without the payment of any royalty.

BACKGROUND OF THE INVENTION

This invention relates to the field of semiconductor devices usable as optical energy to electrical energy transducers or solar cells and to the efficient fabrication of such devices.

The vertical-junction solar cell was proposed in the early 1970's, and in one arrangement thereof is described in U.S. Pat. No. 3,690,953. Such solar cell designs were earlier found to be especially desirable in their ability to minimize the degradation of power generation capability caused by ionizing radiation damage in an aerospace environment. In the evolution of these devices, an article published by one Patrick W. Rahilly, and titled "Vertical Multijunction Solar Cells," and appearing in the May 1972 *Ninth IEEE Photovoltaic Conference Record* at page 85 describes an improved vertical multijunction solar cell which possesses a pn-junction linear density of 2000 junctions per centimeter.

Although this improved solar cell design also proves to have desirable radiation hardening characteristics, cells of the reported type, are found to possess several major disadvantages-disadvantages which are, for example, described in the additional published article "Vertical Multijunction Solar Cell Fabrication", appearing in the *Conference Record of the Tenth IEEE Photovoltaic Conference*, pages 194–195, 1973. Such solar cells, for example, typically have a significant recombination current loss which results from their large pn-junction periphery, have poor power generation efficiency at short incident light wavelengths, and have metal contacts which are difficult to fabricate with desirable reliability due to their closely spaced pn-junction regions.

As a result of embodying the 1973 article's work, conversion efficiencies as large as 5.5 percent are observed. Analysis reveals that this relatively low performance can be attributed to the large series resistance resulting from long path lengths that the cell's generated carriers must traverse prior to collection by the surface-mounted, metallized-grid contact structure of the cell array. A further effort supported by the Solarex Corporation of 1335 Piccard Drive, Rockville, Md. 20850 additionally optimizes the vertical multijunction solar cell, achieves conversion efficiencies greater than 15 percent, and is reported in a U.S. Government report, AFWAL-TR-Bl-2052 titled: "Silicon Solar Cell Optimization," dated June 1981, available from the Defense Technical Information Center (DTIC), Defense Logistics Agency, Cameron Station, Alexandria, Va. 22304-6145 as AD A106005 (92 pages). Reliability tests reveal, however, that the walls of the improved vertical pn-junction solar cell are structurally weak and can fracture when thermally cycled between the temperatures of 77° K and 373° K, for example.

Several arrangements have also been proposed to improve the mechanical robustness of the vertical multijunction solar cell; these arrangements include, for example, the cells of U.S. Pat. No. 4,409,423, and U.S. Pat. No. 4,420,650, which are described below. While each of these designs possess superior mechanical strength, both manifest conversion efficiencies which are often less than 2 percent.

One subsequent proposal to increase the conversion efficiency of a solar cell incorporates an interdigitated back-contact feature; such cells are described in the article "The Interdigitated Back-Contact Solar Cell. A Silicon Solar Cell For Use in Concentrated Sunlight", which appears in the *IEEE Transactions on Electron Devices*, vol. ED-24, pages 337–342, April 1977. While this design eliminates the self-shading losses contributed by a solar cell's surface conductor grid, its long pn-junction carrier diffusion lengths make it undesirably radiation sensitive.

The present invention, however, achieves increased solar cell conversion efficiency without sacrificing radiation hardening and structural strength. The invention, moreover, combines the vertical-channel concept with the interdigitated back-contact concept to achieve a cell of significantly increased practical utility. The disclosed cell arrangement also totally eliminates self-shading of the active surface, has minimal reflection losses, minimizes the undesirable carrier recombination current loss, is amenable to silicon fabrication processes, and enhances the physical robustness of the solar cell array.

The prior patent art includes several examples of inventions relating in a general sense to the present invention. Included in these is U.S Pat. No. 4,420,650 issued to J. F. Wise et al, a patent also assigned to the U.S Air Force. The Wise et al '650 patent is especially concerned with a vertical-junction solar cell that is fabricated on (110)- oriented silicon and in which the light transducing surfaces are disposed along the length of the wafer's transversing grooves-in accordance with a predetermined relationship between the groove's depth and the individual solar cell element's length. The Wise et al patent is also concerned with differing etch rates in differing crystallographic planes and with the use of potassium hydroxide as an orientation-dependent etchant.

The Wise et al patent also shows disposal of individual solar cell elements in parallel grooves with a 50% lengthwise displacement of cells in adjacent grooves. Notwithstanding these points of similarity between the Wise invention and the solar cell described herein, it is to be noted that the Wise et al apparatus is concerned with a solar cell in which the individual cell cavity is relatively shallow with respect to the host wafer's thickness, employs metallic electrical contacts on both the top and bottom surfaces of the solar cell structure, does not realize the advantages of the pointed top surface cavity walls, has lower pn-junction density, and does not realize the advantages of the present invention cell cavity etch termination arrangement in its fabrication.

The present invention therefore, adds a significant contribution to the solar cell art over the disclosure of the Wise et al '650 patent.

Another patent by J. F. Wise, also assigned to the U.S. Air Force, U.S. Pat. No. 3,690,953 describes one of the earlier arrangements of a vertical pn-junction solar cell and involves the side by side placement of p- and n-semiconductor materials together with an overlay of current collecting and conducting metallic paths disposed on the cell's light receiving surface. The surface disposition of the current conducting stripes and the absence of individual solar cell cavity structures are significant points of distinction between the '953 patent and the present invention.

Another patent concerned with solar cells and similar devices, U.S. Pat. No. 4,101,351, in the name of P. L. Shah et al, involves pn-junction formation arrangements, anti-reflective coatings, and improved metallization arrangements for silicon solar cells of both the planar disposed and vertical multijunction cell types. The use of both front- and back-contacts in the '351 patent is a notable distinction from the present invention.

The U.S Pat. No. 4,409,423 of J. F. Holt is also concerned with vertical-junction solar cells and provides a cell of increased mechanical robustness. The use of front face metallic contacts and the disposition of cells into a wafer hole structure are particularly notable points of distinction between the '423 patent and the solar cell of the present invention.

The patent of R. N. Hall, U.S. Pat. No. 4,427,839, is concerned with a solar cell having rear face electrodes and a frontal surface that is disposed in the form of pyramidal apertures which include a material with a high index of refraction filling the pyramidal apertures. Both the pyramidal aperture structure and the disclosed (100) crystallographic orientation of the substrate are points of notable distinction between the Hall solar cell and that of the present invention.

The U.S. Pat. No. 4,478,879 of C. R. Baraona et al, is also concerned with back-contact solar cells and a method for fabricating such cells. In addition to the planar disposition of the '879 solar cell, the use of screen printing in the cell fabrication process provides notable distinction between the present invention and the '879 solar cell.

In addition, the U.S. patent application Ser. No. 07/282,423 filed Dec. 9, 1988 by E. S. Kolesar Jr. and titled "Hybrid Wafer Scale Microcircuit Integration" is concerned with the disposing of cavities in the surface of a semiconductor wafer by orientation dependent etching. The shape utilization and filling of the cavities in this application differ from the present inventions, however.

SUMMARY OF THE INVENTION

The present invention involves a vertical-junction solar cell having backside electrical contacts, improved radiation resistance and physical integrity, high cell cavity density, enhanced radiant energy or incident light trapping ability, a low carrier recombination loss disposition, and a physical arrangement of the individual cells which has both performance and fabrication advantages. Each contributing solar cell in the described array is disposed in the form of a "Vee" bottom-shaped cavity with the endwise and laterally contiguous cells in the array being disposed in parallel grooves which traverse the face of the host semiconductor wafer.

An object of the present invention is, therefore, to provide a solar cell arrangement which provides desirable high resistance to ionizing radiation effects.

Another object of the invention is to provide a solar cell arrangement which avoids the commonly used frontal electrodes and electrical conductor arrays.

Another object of the invention is to provide a vertical-junction solar cell which has improved light or radiant energy capturing ability.

Another object of the invention is to provide a vertical-junction solar cell having desirable physical integrity or mechanical robustness.

Another object of the invention is to provide a solar cell arrangement in which the efficiency-reducing phenomenon caused by the recombination of carriers within the cell's semiconductor body is minimized.

Another object of the invention is to provide a solar cell arrangement in which increased optical energy to electrical energy transducer efficiency is attained.

Another object of the invention is to provide a solar cell arrangement in which the collection of current carriers in the bulk semiconductor material of the cell is improved by the use of pn-junctions that are disposed intermediate the bulk semiconductor material and the electrode elements.

Another object of the invention is to provide a vertical-junction solar cell arrangement in which the benefits of (110)-oriented semiconductor material are utilized.

Another object of the invention is to provide a vertical-junction solar cell fabrication arrangement which enables desirable noncritical anisotropic etch time to realize the solar cell's vertical cavities an anisotropic etch process incorporating an "etch-stop" feature.

Another object of the invention is to provide a vertical-junction silicon solar cell arrangement which utilizes the fabrication advantages of a cell extending through the host wafer's thickness.

Another object of the invention is to provide a vertical pn-junction solar cell array isotropic etch process which is used to "point" the top-surface or light collecting surface of the array cell in order to minimize light reflection losses.

Additional objects and features of the invention will be understood from the following description and the accompanying drawings.

These and other objects of the invention are achieved by a vertical-junction back-contact solar cell apparatus which includes the combination of a wafer of semiconductor material having upward and downward facing surfaces and a predetermined thickness, crystal orientation, first dopant type and concentration, an array of radiant energy capturing cavity members disposed in substantially parallel rows across the semiconductor wafer upward facing surface, with each of the cavities including an internal surface area received layer of pn-junction forming a first grid of electrically interconnected electrodes dispersed across the downward facing wafer surface in registration with predetermined first electrical polarity current collection regions of each said pn-junction inclusive cavity member, a second grid of electrically interconnected electrodes electrically segregated from the first grid and dispersed across the downward facing wafer surface in registration with predetermined second polarity current collection pn-junction inclusive regions of each said cavity member.

BRIEF DESCRIPTION OF THE DRAWINGS

FIG. 4 shows four views of one cavity of a solar cell array of the FIG. 1 and FIG. 2 type.

DETAILED DESCRIPTION

Figure 1:
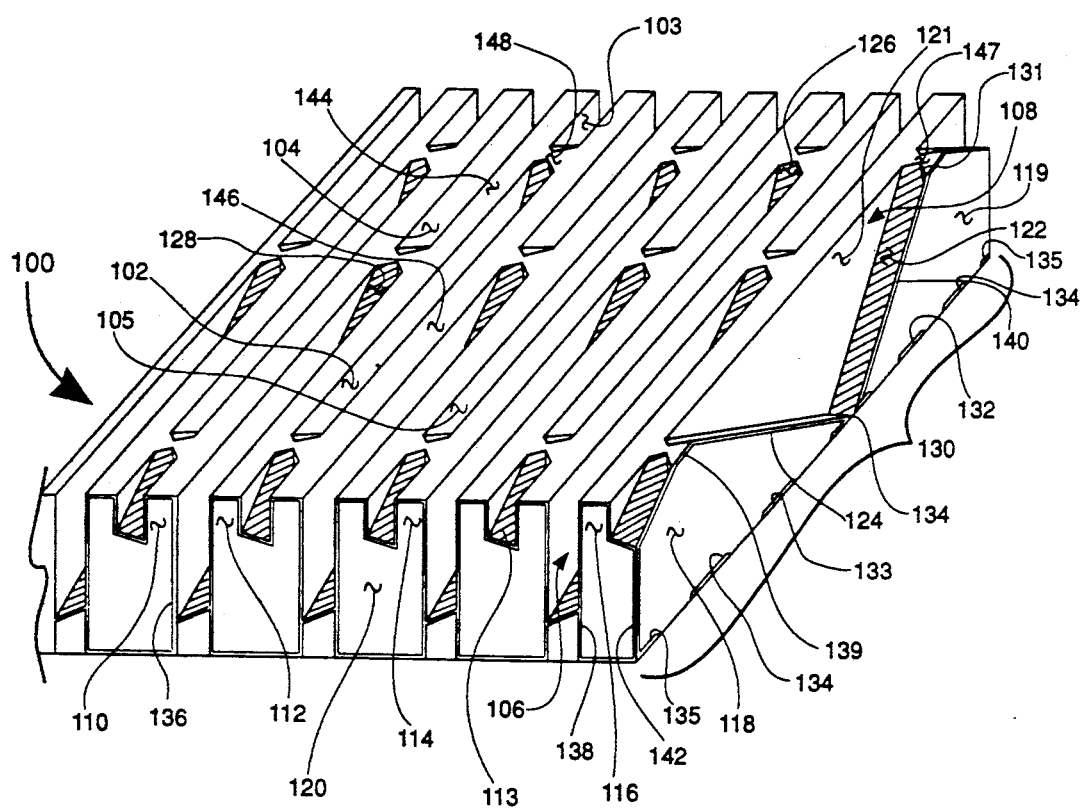
FIG. 1 shows a perspective view of a back-contact vertical-junction solar cell array arranged according to a portion of the present invention.

FIG. 1 of the drawings shows a not to scale perspective representation of a section extracted from an array of back-contact vertical-junction solar cells made according to the present invention. As shown in FIG. 1, the array section 100 includes a plurality of endwise adjacent individual solar cells, such as the cells of cavities 102 and 103. Laterally contiguous of these endwise adjacent cavities in FIG. 1 are another series of (½) lengthwise displaced solar cell cavities as are represented, for example, by the cell cavity 104.

Disposed intermediate the lengthwise adjacent cavities 102 and 103 in the FIG. 1 array are a series of endwise divider sections, such as the divider section 148. Located between the typical laterally adjacent cavities 102 and 104 in the FIG. 1 array is a series of upstanding rib members, such as the typical rib members 144 and 146. The rib member separated cavities may be considered to be disposed in the form of grooves which extend across the upward facing surface of the semiconductor wafer hosting the array 100 in FIG. 1. A cross-sectional representation of the substrate material below a cavity floor and adjacent an endwise divider section of the type shown at 148 in FIG. 1 may be viewed in the frontal-most portion of the FIG. 1 array. The numbers 110, 112, 114 and 116 indicate cross-sectional portions of the upstanding rib members of the type indicated at 144 and 146.

The right-most cavity of the array 100 in FIG. 1 is shown in a cutaway condition and is indicated by the number 108 in the FIG. 1 drawing. The cutaway representation of the cavity 108 enables viewing of the cavity's lateral surface 121 and bottom surface 122, and also shows the configuration of the bulk semiconductor regions 118 and 119 on which the cavity's bottom surfaces 122, 124, 126 and 128 are formed.

In the presently described preferred embodiment of the invention, the bulk semiconductor of the regions 118 and 119 in FIG. 1, for example, is preferably p-type silicon material while all of the exposed cavity surfaces, e.g. the surfaces 121, 122, 124,, 126, and 128 are n+ diffused regions. The presence of these surfaces of n+ semiconductor material together with the p-type material in the semiconductor body portions of the FIG. 1 structure, of course, results in a diffused region residing at the interface of these two materials and thereby adjacent the cavity surfaces.

According to the present invention therefore, it is contemplated that each of the surfaces shown in the cutaway cavity 108, that is, the typical bottom surfaces 122, 124, 126, and 128, and the typical lateral surface 121, have been subjected to a semiconductor dopant thermal diffusion process during formation of the FIG. 1 structure. This diffusion process causes the pn-junction—a junction usable for radiant energy transducing, to reside immediately below each of these cavity surfaces. The presence of this subsurface pn-junction is, therefore, also presumed in the similar surfaces of the cutaway viewed lateral side 121 of the cavity 108, and it is also presumed in the similar surfaces of each of the other cavities illustrated in the FIG. 1 structure.

The presence of this diffused layer or doped semiconductor region and a pn-junction in close proximity to each of the cavity surfaces in the FIG. 1 array section is indicated by the typical lines 136, 138, 139 and 140 in the cross-sectional portions of FIG. 1. By way of this diffusion and the resulting pn-junction formation, each of these surfaces is embodied with the capability of receiving radiant energy or light and forming the electron-hole pairs which contribute to the array's electrical output.

The FIG. 1 solar cell array is also provided with a backside located electrical current collection network which includes additional doped area pn-junctions located in the substrate adjacent a backside metallic collection grid. Although the metallic connection grid is omitted from the FIG. 1 drawing in view of the difficulty of representing such a structure accurately in the scale and perspective used there, details of this metallic grid appear in FIG. 5, step 31 and in FIG. 11 herein. Included in the FIG. 1, however, are the p+ diffusion regions 132 and 133 and the n+ diffusion regions 134 and 135 which comprise portions of the current collection network as is described below herein.

A notable aspect of the FIG. 1 solar cell array concerns the staggered or (½) lengthwise displaced location of laterally adjacent cell cavities. As is indicated typically by the bulk semiconductor region 118 in FIG. 1, this half-length displacement arrangement results in the presence of periodic massive pilasters of semiconductor material in each direction throughout the body of the cell array. Such pilasters add a desirable degree of mechanical integrity and physical robustness to the overall structure of the cell array. These attributes are especially desirable in the case of arrays that are used in aerospace or other high-G force environments, and for solar cell arrays exposed to frequent temperature change cycles.

For the instant invention the 2000 pn-junction per centimeter linear density convention that was established by P. W. Rahilly in the above referred-to paper "Vertical Multijunction Solar Cells" appearing in the Conference Record of the Ninth IEEE Photovoltaic Conference, page 85, May 1972, is a desirable density arrangement since inter alia improved radiation hardness and physical robustness are achievable with the combination of this density and the pilaster 118 structure. Cells with 0.4 inch or 1.016 centimeter square surface collector geometry, 5 micron groove width, 20.4 micron side-to-side or lateral groove separation, and a 16 micron end-to-end separation are achievable with this convention and the FIG. 1 and FIG. 4 cell geometry. The presence of relatively large regions of bulk semiconductor material as shown at 118 is also desirable in achieving ionizing radiation hardness in the present solar cell array.

Also to be noted in the FIG. 1 array is the extension of the solar cell's structure over the full depth of the host wafer's thickness. This thickness is desirable for increasing the ratio of active pn-junction surface area relative to that of the wafer's surface area, and it is additionally and surprisingly helpful in array fabrication as is described below.

Although the typical upstanding rib cross sections 110, 112, 114, and 116 in the FIG. 1 solar cell array are shown to have a somewhat rectangular upper cross-sectional shape, this contour is actually shown primarily for drawing clarity convenience in FIG. 1, and a more rounded shape for this upright rib upper cross-sectional region is actually preferred for use in the invention. The preferred shape of this upper cross section is shown in cross section, in FIG. 2 of the drawings.

Figure 2:
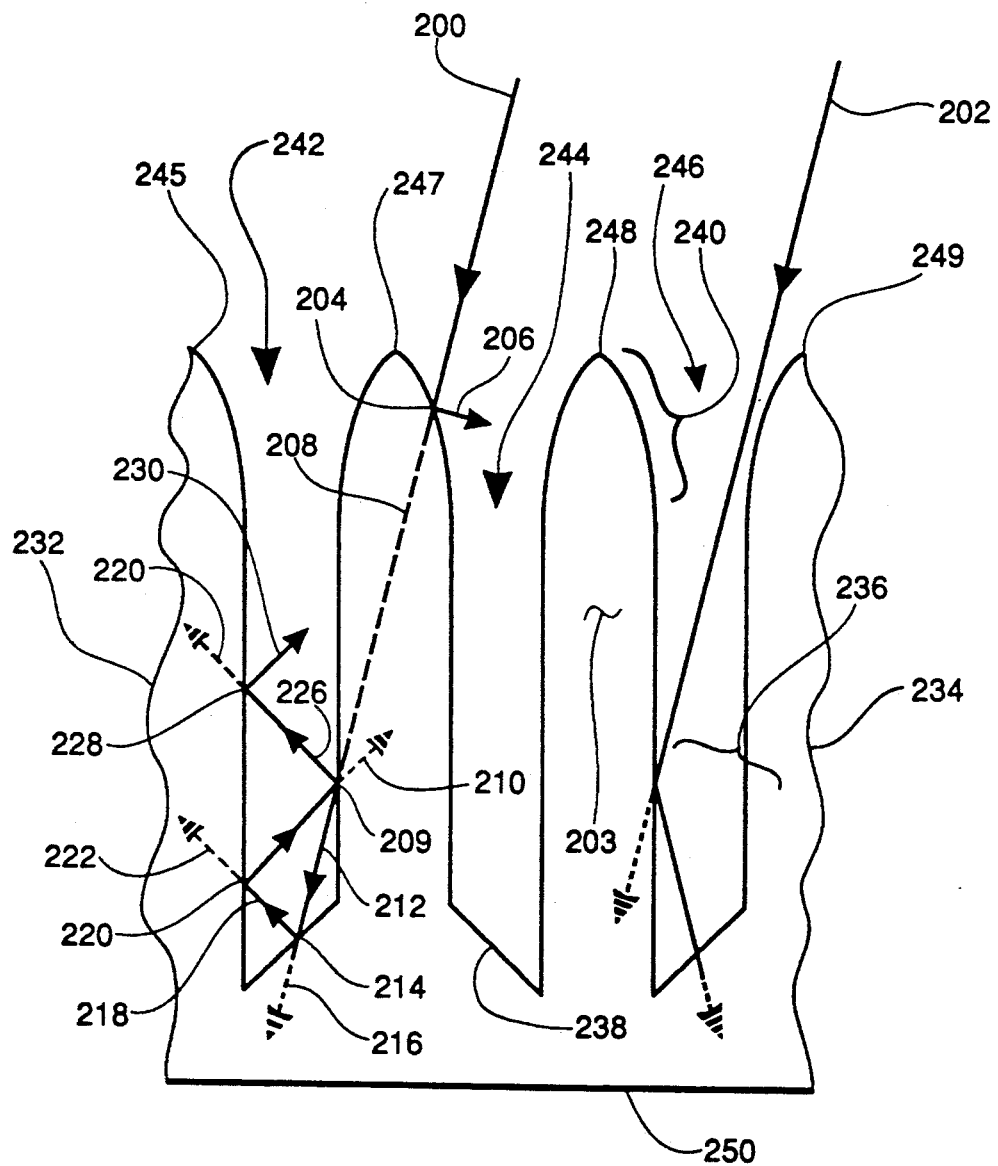
FIG. 2 shows several grooves in the FIG. 1 solar cell array in cross section.

The FIG. 2 drawing represents an endwise view of a segment of the FIG. 1 type solar cell array. FIG. 2 is actually a view taken at a point located about ⅓ of a cavity length between the valley point 134 and the endwise divider section 147 in FIG. 1. This location is ascertainable from the amount of bulk substrate material shown between the cavity bottom 238 in FIG. 2 and the downward facing substrate surface 250.

FIG. 2, therefore, shows a solar cell array segment having three solar cell cavities 242, 244, and 246; four upstanding rib members of the type previously shown at 144 and 146 in FIG. 1; and a rounded corner and peaked top rib cross-sectional configuration which is shown at 245, 247, 248, and 249. The rib cross sections at 245 and 249 are shown to be cutaway by the break lines 232 and 234.

The rounded upper corner cross-sectional shape shown in FIG. 2 is preferred for use in the solar cell array invention over the square cornered rib cross sections shown at 110, 112, 114, and 116 in FIG. 1 principally because of its improved ability to capture incident radiant energy or light falling on the array surface—as is explained in greater detail below. As a result of an additional isotropic etching sequence, which is also described below, the upper square cornered portions of the upstanding rib members in FIG. 2 have been removed to leave the smoothly rounded and pointed cross-sectional shape shown in the region 240. This rounded cross-sectional shape is somewhat similar to a gothic arch or segment of an ellipse in appearance.

The incident photon paths 200 and 202 which are also shown in FIG. 2, illustrate one manner in which the rounded corner solar cell array of the present invention is capable of capturing a large fraction of the radiant energy or light it receives. The paths 200 and 202, in fact, enter upon a sequence of high reflection and transmission absorption events that are to be expected with the described arrangement of the FIG. 2 cavity rib members and cavity bottom surfaces and the pn-junctions attending these surfaces.

As indicated along the path 200, at the first point of received energy incidence, the point 204, a combination of energy reflection along the path 206 and transmission along the path 208 occur. The energy fractions appearing in each of the reflection and transmission components 206 and 208 in each photon instance are, of course, dependent on a number of variable factors including surface reflectivity, the energy incidence angle, the energy spectral content, and other factors. Energy not reflected at the point 204 is, of course, transmitted though the array body along a path of the type indicated at 208, and generates during transmission through the pn-junctions of lines 136, 138, and 139 in FIG. 1, charge carriers of the electron and hole type which are desirably collected as the electrical output of the solar cell array.

A portion of the energy communicated along the path 208, therefore, reaches the point 209 and emerges from the semiconductor material to travel along the path 212 to the second point of incidence 214, where again, reflection along the path 218 and absorption along the path 216 occur. For the sake of discussion, the paths 208 and 212 are shown to comprise a straight line in FIG. 2 notwithstanding the air to semiconductor interface traversed by these paths and the expected bending of light rays at such interfaces. Similar transmission along the path 214 and absorption along the path 222, therefore, occur at the third point of incidence 220 and repeat again at the point 209 and point 228 and involve the paths of absorption 210 and 220 and paths of reflection 226 and 230. Since the reflected energy at each of these points of incidence can normally be expected to be substantially less than the incident energy, most of the energy received along the path 200 will contribute to the generation of electron-hole pairs. Because of the large number of points of incidence in most paths of the 200 and 202 type, little of the incident energy will escape from the solar cell array at the last or any other point of incidence. In the case of the first point of incidence 204, the reflected energy along the path 206 is, of course, partially absorbed and partially reflected from the adjacent upstanding rib member 203. The energy received along the path 202 encounters a similar series of reflection and absorption events in the region indicated at 236 in FIG. 2.

The rounded corner and deep groove configuration of the upstanding rib members in the solar cell array as shown in FIG. 2 can, therefore, be appreciated to significantly decrease the amount of energy reflected away from the solar cell's surface and to increase the amount of energy received in the cell's array body where the generation of electron-hole pairs ultimately occurs.

As will be understood by persons skilled in the optical arts, radiant energy received along most other paths of incidence in the FIG. 2 solar cell configuration will meet with similar or even more effective absorption sequences as described for the path 200. The rounded corner arrangement indicated for the region 240 in FIG. 2 is, therefore, especially helpful in this absorption sequence for generating plural points of incidence disposed high on the ribs 203, in the regions 240, for example, where many succeeding incident points can follow. This arrangement is also helpful in avoiding loss of received energy through nonrecapturing reflection as can occur in the FIG. 1 structure, for example. The rounded arrangement is therefore a desirable addition to the vertical solar cell geometry.

Several other details of the present invention cavity structure are also visible in the FIG. 2 drawing. The tilted nature of the (111) plane cavity bottoms appearing in the present invention cell cavities is, for example, indicated at 238 in FIG. 2. These tilted bottoms result from predictable crystal orientations attending the cell cavities as is also described below herein. For the sake of drawing clarity, the endwise divider sections at 147 and 148 in FIG. 1, for example, are omitted from the drawing in FIG. 2 along with the cavity surfaces connecting to this endwise divider sections.

Figure 3:
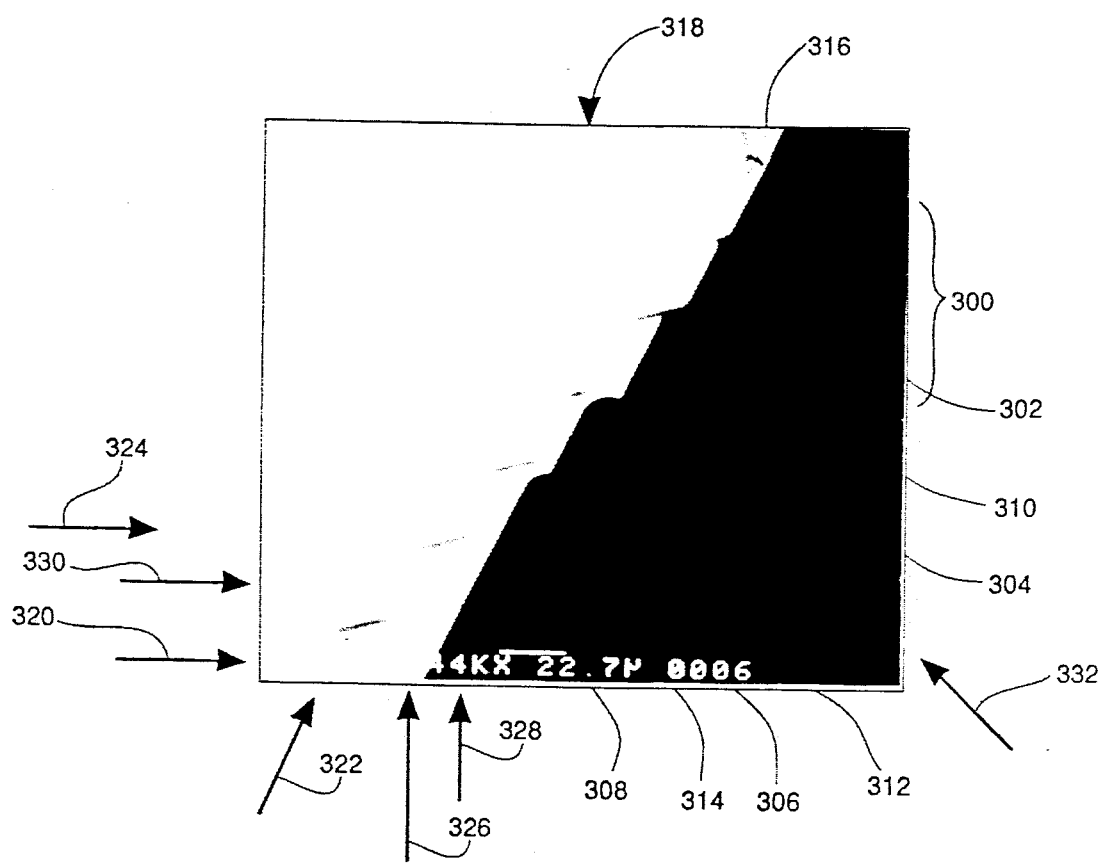
FIG. 3 shows a back and side portion of a scanning electron microscope (SEM) microphotograph of a solar cell array according to the invention.

Referring now to FIG. 3 of the drawings, in view of the glossy photographic paper comprising the FIG. 3 presented microphotograph, references to features appearing in this figure are made with the aid of lead lines and arrows which terminate at the edge of the photograph. A pair of coordinately organized arrows are, for example, used to designate features in the central portion of the microphotograph and arrows disposed at an angle corresponding to the angle of alignment of the feature being described also appear in the microphotograph. As indicated by the information aligned with the arrow 320 in FIG. 3 microphotograph, for example, this microphotograph was obtained while using a scanning electron microscope (SEM) accelerating potential of 30 kilovolts and a magnification of 4400. This microphotograph also has a dimensional scale segment length of 22.7 microns and is the sixth in its series of microphotographs.

Solar cell cavities in the FIG. 3 microphotograph appear as the darkened stripes 302, 304, 306, and 308. In a similar manner the upstanding rib members in this figure appear as the lighter colored stripes 310, 312, and 314. The tilted nature of the cavity bottoms in the present cell array configuration are discernible in the left-hand end of the cavity 308 at the point designated by the coordinate arrows 328 and 330. The similarly tilted bottom surfaces of other cavities in FIG. 3 are not visible as a result of the irregular and skewed nature of the sample break along the line 316. The tilted appearance of the right-hand portion of the cavity aligned with the arrow 332 in FIG. 3 is also the result of the nature of the sample break along the line 316.

Of particular interest in the FIG. 3 microphotograph are the series of short dark lines which are aligned along the arrow 322. The second of these lines is also identified by the arrows 324 and 326. As is described in greater detail in connection with the fabrication sequence disclosed below, these lines represent slits or apertures that are continuations of the cavity bottom surfaces, 122 and 124 in FIG. 1, for example, through the downward facing surface of the host wafer. Alternately stated, these slits comprise an opening of a typical valley point 134 into the wafer's backside surface. As is indicated below, the presence of the slit openings provides certain advantages during fabrication of solar cell arrays according to the present invention. As indicated by comparison with the 22.7 micron scale segment length in FIG. 3 the slits or apertures aligned with the arrows 324 and 326 are very small in size, and are, in fact, on the order of 1 micron in width. By way of this small size, little of the radiant energy received by the array is lost through the slits.

FIG. 4 of the drawings shows four views of a typical solar cell cavity made in accordance with the present invention, together with several dimensional and other details of the cavity. In FIG. 4, a top view of the illustrated cavity appears at 400 in FIG. 4a, a frontal or side view at 402 in FIG. 4b and an end view at 404 in FIG. 4c; the view at 406 in FIG. 4d represents an enlargement of the left-hand end portion of the top view 400. In the FIG. 4 views, the cavity volume or opening is designated with the number 408, and the valley line of intersection between cavity bottom planes is indicated at 414. The rear wall or interior surface of the upward standing rib member of the cavity is indicated by the number 410 in FIG. 4, while the skewed lines of intersection of the cavity planes with the wafer's upward facing surface are indicated at 416, 418, 420, and 422.

Additional details of the typical cavity appearing in FIG. 4 include the cavity length, depth, and width dimensions which are designated at 428, 430, and 432 in FIG. 4. A number of three-digit crystallographic plane identifications and crystal direction identifications are also shown at 434 and 435, for example, in FIG. 4. The three numbers of these identifications comprise various combinations of the digits '1 and $-1$, with the digit $-1$ being indicated by the placement of a bar over the number. The convention used in these plane and direction identifications, that is, the convention wherein planes are identified with numbers in a set of ( ) parenthesis, equivalent plane sets are identified with numbers set off by {} braces, directions of planar facings are identified with numbers in [] brackets and equivalent directions are identified with numbers set off with < less-than and > greater-than signs, are concisely described in the textbook "Semiconductor Devices-Physics and Technology by S. M. Sze, published by John Wiley and Sons, N.Y., 1985 in cooperation with Bell Telephone Laboratories, see pages 5-7. The Sze text is hereby incorporated by reference herein.

A typical equivalent direction, defining the face direction of the rear wall upstanding rib member 410 is indicated at 435 in the top and end views of FIG. 4 while a typical plane identification, for the tilted cavity bottom surface 426, is indicated at 434 in FIG. 4. As is suggested by the precise identification of planes and plane directions shown in FIG. 4, one aspect of the present invention is concerned with the use of (110) oriented semiconductor material, such as silicon, for hosting the solar cell array and also with the precisely determined planes and plane angles which result from the use of this material. One determination of this type of material is associated with the tilted cavity bottom surfaces 424 and 426 in FIG. 4b.

Several other of the lines and planes shown in FIG. 4 are identified as to either plane of residence or equivalent direction. For example, the line 436 in FIG. 4b represents the intersection of the (111) and ($1\bar{1}1$) planes, the valley line 414 resides in the intersection of the (111) and ($1\bar{1}1$) planes of the tilted cavity bottom surfaces, the sloped lines 418 and 420 represent the intersection of the (110) upward facing surface of the host wafer with the cavity bottom disposed (111) and ($1\bar{1}1$) planes, and the lines 416 and 422 represent vertically oriented planes directed in the $<1\bar{1}1>$ direction. Another representation of these vertically oriented planes appears at 131 and the similar locations of each cavity in the FIG. 1 drawing.

Additional details of the typical solar cell cavity shown in FIG. 4 include the angles 438 and 440 between plane resident lines of the cavity and the length dimension L1, which is indicated at 442 in FIG. 4. The angles 438 and 440 are also precisely determined by the (110) nature of the host semiconductor wafer and the anisotropic etching of the cavity in FIG. 4. The angles 438 and 440 can be further understood from the published technical article "Deep Anisotropic Etching Of Tapered Channels in (110)-Oriented Silicon" which is authored by the two inventors of the present document and published in the journal *Chemistry Of Materials* volume 1, number 6, November-December 1989, pages 634–639, especially pages 635 and 636. The disclosure of the *Chemistry of Materials* article is hereby incorporated by reference herein. The angles 438 and 440 are two typical of the angles defined by intersecting crystalline planes in the FIG. 4 cavity arrangement; the size of these and other FIG. 4 angles can also be calculated using the following two mathematical relationship as is disclosed by one B. D. Cullity in the text "Elements of X-ray Diffraction", published by Addison-Wesley Company, Mass., in 1956. That is, $$\theta = \cos^{-1}\frac{(h_1 h_2 + k_1 k_2 + l_1 l_2)}{[(h_1^2 + k_1^2 + l_1^2)(h_2^2 + k_2^2 + l_2^2)]^{\frac{1}{2}}} \quad (1)$$

To specify the groove length that will produce a backside slit of minimum (FIG. 3) cross-sectional area, the following relationship may be obtained from FIG. 4 and equation (1):

$$L = 2(d) \, 3^{\frac{1}{2}} - W/2^{\frac{1}{2}} \quad (2)$$

where L is the groove length, d is the groove depth, and W is the groove width. Equation (2) has been verified experimentally and documented in the *Chemistry of Materials* article.

The terms $(h_1 k_1 l_1)$ indicate the Miller indices of one intersecting plane, and the terms $(h_2 k_2 l_2)$ indicate the Miller indices of the other intersecting plane. The relationships between the cavity's length, depth, and width shown in FIG. 4 may be derived from these Miller indices and equation (1), and the geometry of the FIG. 4 drawing.

A desirable arrangement for the cavity and solar cell shown in FIG. 4 is to provide a length L of 1000 microns, a depth d of 290 microns and a width W of 5 microns with center-to-center spacing of adjacent cavities being 25.4 microns, and with the endwise divider sections 147 and 148 in FIG. 1 being 16 microns from cavity to cavity length at the wafer top surface extremity thereof. This 16 micron distance is actually 16 microns on the photomask-at 606 in FIG. 6, but, after etching, it is about 15 microns.

FIG. 5 in the drawings shows a sequence of steps by which solar cell arrays in accordance with the invention may be fabricated. The FIG. 5 sequence includes thirty one different steps that are shown in somewhat close detail in order that the required processing be fully described. In lieu of the customary practice of disclosing processing steps by way of a sequence of arrow-connected flow diagram blocks, the FIG. 5 sequence is disclosed by way of differing workpiece views of the host wafer with each view representing physical features achieved after performance of the processing steps through that level. The most significant of the FIG. 5 processing steps are, moreover, designated with an asterisk as is shown at 501 and 513 in the first sheet of the FIG. 5 drawings, for example. Additionally each of the processing steps shown in FIG. 5 is provided with a step number which is located to the left of the drawing. The processing step sequence shown in FIG. 5 and described below is preferably accomplished using a five-level photolithographic mask set with the individual masks in this set being identified as shown in the following Table 1.

TABLE 1

| PHOTOLITHOGRAPHIC MASK | DESCRIPTION |
|---|---|
| 1 | vertical groove etching |
| 2 | p+ diffusion |
| 3 | n+ diffusion |
| 4 | contact etching |
| 5 | conductor patterning |

Returning to FIG. 5, the host wafer is shown in the starting condition at step one in FIG. 5. This wafer is preferably a Czochralski grown silicon wafer of 2 inch diameter, 2-sided polished surfaces, a thickness of 290 micrometers, and resistivity in a range of 1 to 3 ohm-centimeters that is achieved with boron doping that is, a p-type homogeneous semiconductor.

A layer of thick oxide 502 is formed on each side of wafer 500 in the step 2 of FIG. 5. The oxide layer 502 is preferably thermally grown at 900 degrees centigrade using a steam oxide growth process. This oxide layer is covered with negative photoresist on the top surface of the wafer as is shown at 504 in step 3 of FIG. 5. This photoresist layer 504 is subjected to an exposure, development, and hard-baking sequence in which the patterns of a groove mask are imposed therein as is shown by the typical patterns of step 4 and as indicated at 506 in FIG. 5. A hexamethyldisilizane [(CH$_3$)$_3$SiNH-S$_i$)(CH$_3$)$_3$] or HMDS and positive photoresist layer are applied to the wafer's backside and hard-baked as indicated at 508 in step 5.

Silicon wafers with the desired (110) orientation are commercially available with a thickness on the order of three hundred microns; the thickness of these wafers can be decreased to the 290 micron value described in conjunction with step 1 of FIG. 5 by using an isotropic (planar) chemical polishing etchant that is composed of hydrofluoric acid, nitric acid, and glacial acetic acid in a volume mixture of 2:15:5; this etchant produces an etching rate of approximately of 5 microns per minute. Prior to decreasing the wafer's thickness in this manner, however, it is desirable to compensate for the approximately 44 percent of the thickness of silicon consumed during the oxide mask growing process in step 2 of FIG. 5. The post oxidation wafer working thickness of 290 microns calls for a FIG. 4 cavity length of 1000 microns according to the herein described relationship between groove length depth and width of equation (2).

In the published article "Orientations of the Third Kind: The Coming of Age of (110) Silicon in Micromachining and Micropackaging of Transducers" published by Elsevier Science Publishers Amsterdam, authors Kendall and Guel, at pages 107-133 predict that an oxide mask thickness of approximately 2 microns provides a sufficient margin of safety during the etching of the grooves that are approximately 290 microns deep. This oxide thickness is also sufficient to mask the subsequent diffusions of step 14 and 20 in FIG. 5.

The top oxide layer 502 is etched as indicated in step 6 of FIG. 5 to achieve the groove mask feature 510. The feature 510 is shown in step 7 following removal of the photoresist from both sides of the wafer, and this feature is identified as the location of cavity etching in step 8 of the FIG. 5 sequence. Three solar cell cavities are illustrated at 512, 514, and 516 in the step 8 view. These cavities are the result of an orientation dependent or anisotropic etch with potassium hydroxide and water to produce cavity grooves in the wafer upward facing surface.

The isotropic etch of step 8 in FIG. 5 requires about 180 minutes of time when accomplished with a 50% by weight solution of potassium hydroxide and water at a temperature of 85 degrees centigrade. Etching slightly longer than 180 minutes is not a critical problem in fabricating the array, since, the etching proceeds at a significantly slower rate once the etch exposed {111} planes intersect the backside of the host wafer. An 85 degree centigrade solution of potassium hydroxide is found to achieve a <110>-directional etch in step 8 of FIG. 5 that is approximately 100 times the etch rate for [111] direction silicon. This fast rate of etching is enabled by the ability of the (110) plane host semiconductor material to "access" material that is oriented in other directions during the step 8 processing, and notably, this fast rate enablement terminates upon etch-through of the wafer material to form the cavity valley point slits shown in FIG. 3. The etch of step 8 in FIG. 5 may be accomplished in the isothermal etch equipment known as a Lufran Superbowl II reflux etching system which is available from Lufran Incorporated of Macedonia, Ohio.

The orientation-dependent or anisotropic etch phenomenon of step 8 in FIG. 5 has been attributed to the crystallographic properties of the various planes in a crystal, and it has also been experimentally verified to be particularly sensitive to the atomic packing density existing in the various planes. Accordingly, the relative etch rate of the silicon material decreases as the atomic packing density of the material increases. Since the packing density of silicon atoms is greatest in the <111> direction, the [111]-planes etch much slower when compared to either the [100]- or [110]-planes in step 8 of the FIG. 5 orientation-dependent etch operation. Following the step 8 etch an additional negative photoresist layer 518 is applied to the backside of the wafer and soft-baked as is shown in step 9.

Step 9 in the FIG. 5 sequence also indicates the corner rounding and to pointing activity in which tips of the gothic arch cross sections of the upstanding rib members 144 and 146 in FIG. 1, for example, are pointed. For accomplishing the step 9 etch, a chemically hard polyimide photoresist 513 can be used to protect the wafer's backside oxide while an isotropic (planar) buffered etch solution is used to shape the corners of the upstanding divider ribs. The isotropic buffered etchant may consist of hydrofluoric acid, HF; nitro acid, $HNO_3$; and acetic acid, $CH_3COOH$; in a volumetric ratio of 2:15:5; and may be used for five minutes with an etching temperature of about 22° C. to accomplish the rib shaping indicated in step 9 of FIG. 5. A microphotograph showing the results of the step 10 isotropic etch process is shown in FIG. 7b of the drawings This photoresist layer 518 is aligned with the p+ mask, exposed, developed, and hard-baked to provide for the masking arrangement shown in step 11 of the FIG. 5 sequence.

Commencing with step 11 in FIG. 5, the wafer workpiece is shown to be rotated 90 degrees about a vertically disposed axis, an axis which passes parallel to the walls of the cavity 514 in the step 8 view, for example. By way of this rotation the cavity bottom surface indicating lines 517, 519, 521, and 523 in step 11 are made visible in the step 11 drawing.

A p+ mask provides the backside features 520 and 522 shown in step 11 of FIG. 5. Realization of these features as oxide apertures is indicated at 524 and 526 in step 12 of FIG. 5, and removal of the photoresist 518 covering the oxide intermediate the apertures is indicated in step 13.

Figure 8:
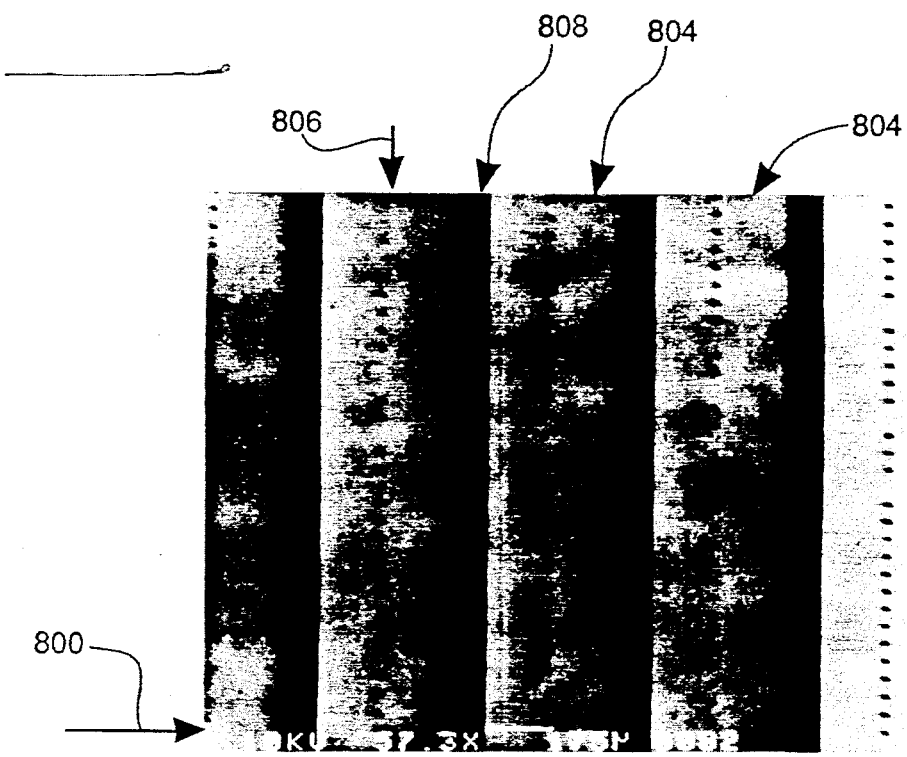
FIG. 8 shows the backside of a FIG. 1 solar cell array after a p+ diffusion.

By way of the oxide apertures 524 and 526, a diffusion of p+ impurities into the host wafer semiconductor material is accomplished in step 14; the diffusion process is indicated by the arrows 528 and 530 and the resulting region of p+ impurity indicated at 532 and 534. The p+ impurity regions 532 and 534 and the resulting pn-junctions at these locations provide improved collection of the hole and electron carriers generated by light or radiant energy impinging upon the upper surfaces of the solar cell array. A backside view of a cell array following step 14 processing is shown in FIG. 8 of the drawings.

A layer of oxide 538 is grown over the impurity regions 532 and 534 in step 15 of FIG. 5 concurrently with driving the step 14 dopant into the semiconductor bulk material. In order to sufficiently mask the subsequent n+ diffusion in step 20 of FIG. 5, an oxide barrier of approximately 2000 angstroms thickness is desired at 538 in step 15. As is symbolically indicated by the topside layer of oxide 536 an oxide layer also grows over the surface of the groove walls during growth of the backside layer 538. This layer 536 is removed by the hydrofluoric acid etch in step 18 below. Such removal may be assisted by the presence of a wetting agent in the hydrofluoric acid solution in order to overcome surface tension effects and encourages entrance of the etchant into the small dimensions of the topside grooves structure. A reactive ion etching process may also be employed to accomplish or supplement this oxide removal process from the groove structure.

Another layer of negative photoresist 540 is applied to the backside and soft-baked in step 16 of FIG. 5. This layer of photoresist is used to form an n+ diffusion reception feature 544 by way of the masking exposure, at 542 and the development and hard-baking sequence of step 17, and the oxide etch and photoresist removal activities in steps 18 and 19 of FIG. 5.

The diffusion indicated by the arrows 553, 554, and 555 in step 20, an n+ phosphorus diffusion, is intended to achieve an 80 to 85 ohms-per-square sheet resistance value in order that minimum contact resistance results. The achieved regions of the n+ diffusion are indicated at 556, 557, and 558 in the step 20 drawing.

As indicated by the arrows 546, 548, 550, and 552, the n+ diffusion of step 20 also acts on the exposed cavity bottom surfaces and cavity sidewall surfaces of the wafer 500. These upper surface n+ diffusions provide the radiant energy or light receiving pn-junctions of the solar cell.

With regard to the physical locations of the diffusion regions 556, 557, and 558 in FIG. 5 with respect to the cell structure, it is believed helpful to interrupt description of the FIG. 5 sequence and briefly consider the relationship between such locations and the recombination losses encountered in the present and other solar cell arrangements. Once an electron-hole pair is created in a solar cell, the electron must be separated from the hole to produce useful energy. If an electron-hole pair is fortuitously created within the space-charge region of the solar cell, the electron is immediately swept within the space-charge region of the solar cell, the electron is immediately swept to the narrow n-side, and the hole to the p-side. However, most electron-hole pairs created by photon absorption in a solar cell are not generated within the space-charge region of the cell. Therefore, the probability of separating an electron and hole before they recombine will depend on how close the electron-hole pair is created to a charge collection pn-junction (i.e. the junction resulting at 556, 557, and 558 in FIG. 5). If an electron-hole pair is created on the p-side, its electron has a high probability of recombining with the numerous holes on the p-side. Likewise, when an electron-hole pair is created on the n-side, the hole has a high probability of recombing with the numerous electrons on the n-side. Therefore, the probability of separating electrons and holes is dependent on the minority carrier diffusion lengths in the n-materials and p-materials. The minority diffusion lengths in the n-material ($L_n$) and p-materials ($L_p$) are predicted by the equations $$L_n = (D_n \tau_n)^{\frac{1}{2}} \tag{3}$$

$$L_p = (D_p \tau_p)^{\frac{1}{2}} \tag{4}$$

Where $\tau_n$ and $\tau_p$ are the minority carrier lifetimes in the n-materials and p-materials (with units of seconds), and $D_n$ and $D_p$ are the diffusion coefficients for minority carriers in the n- and p-materials, respectively and have units of cm² per second. Typical values for diffusion lengths in Si units are on the order of 100 micrometers. One might note that if a solar cell was made very thin, the electron-hole pairs would always be created very close to the collection junction. However, thin solar cells are very fragile, and do not completely absorb all incident light since some passes through the cell and results in additional loss. A relatively, thin solar cell which traps the light within the cell as described herein, however, increases the achieved cell efficiency.

In the presently disclosed vertical-junction solar cell the cavity surfaces are n+ so the bottom of the cavity is contacted directly to bottom surface metal. The p+ regions and the associated metal contacts are located between each adjacent n+ region and metal contact to minimize recombination current losses, the n+ and p+ metal contacts need to be close together, hence the symmetry shown herein. These recombination phenomenon considerations therefore result in the backside placement of the output electrodes and their associated pn-junctions in close physical proximity to the depletion regions of the step 20 cavity surface diffusion generated pn-junction.

Recombination of electron-hole pairs in silicon is caused primarily by indirect recombination. The actual mechanisms which cause electron-hole recombinations are empty, or dangling bonds from crystal lattice impurities or defects; such mechanisms can capture free electrons or holes.

Figure 12:
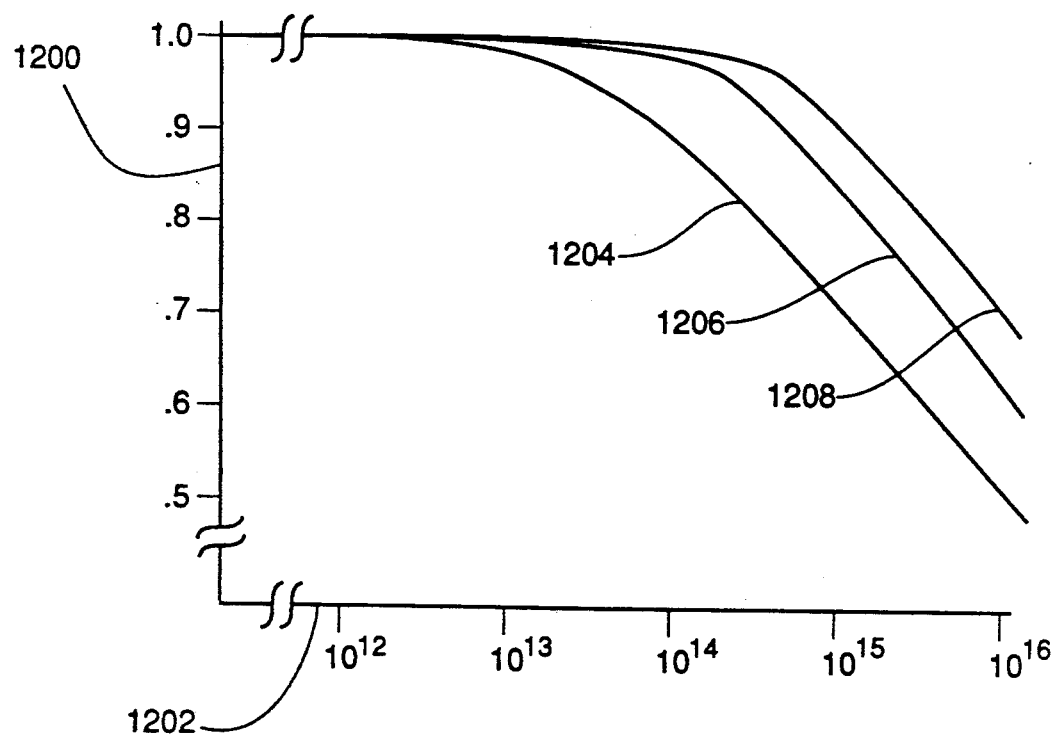
FIG. 12 shows the effect of ionizing radiation of solar cell performance.

Radiation in space is a primary source for causing defects in satellite carried solar cells. When a high energy particle impinges upon the silicon substrate, it may displace a silicon atom from the lattice, and thus create a dangling bond in the vicinity of the vacancy. Consequently, the greater the number of defects, the shorter the diffusion length of minority carriers, and the greater the probability of recombination. FIG. 12 in the drawings, in fact, shows the effect of electron damage on three different types of solar cells. In this figure the vertical scale 1200 represents normalized maximum power, the horizontal scale 1202 the number of electrons per square centimeter in an electron fluence of one million electron volts energy level, the curve 1204 the output of a conventional solar cell, the curve 1206 the output of a thin solar cell and the curve 1208 the output of a vertical-junction cell. As is readily discernible in this relationship; therefore, high radiation is notorious for creating recombination centers especially in conventional cell configurations.

Returning now to FIG. 5, the metallized, aluminum electrical connections for each cavity of the solar cell array are provided in the steps 21-26 of FIG. 5. In this sequence, a thin oxide layer is grown over the exposed layer of the silicon host wafer 500 at 560 in step 21, and a photoresist film is applied and soft-baked at step 22 as shown at 562. The photoresist is provided with feature apertures at 564, 565, 566, 568, and 570 of step 23, using a mask 567 and the oxide at these feature aperture locations is etched away to provide the oxide apertures 572, 573, and 574 in step 24 of FIG. 5. The photoresist is removed in step 25. Aluminum is applied to the exposed impurity regions of the oxide apertures 572, 573, and 574, as is shown at 576 in step 26 of FIG. 5. This aluminum 576 is applied in the form of an evaporation covering the wafer backside.

Etching through of the aluminum film 576 provides the individual conductors indicated at 579 in step 30 of FIG. 5. The etching is accomplished in steps 27-30 in FIG. 5 and includes the use of photoresist 578 and a soft-bake period in step 27, a mask exposure, development, and hard-baking in step 28, and an etching of the aluminum and removal of the photoresist from step 27 in steps 29 and 30. The separation spaces between adjacent aluminum conductors are shown in developed photoresist form at 580 and 582 in step 28 of FIG. 5, and in an etched oxide form at 584 and 586 in step 29. The oxide in step 28 is represented by slightly thicker lines except in the etched areas 584 and 586. An etchant consisting of phosphoric acid, glacial acetic acid and nitric acid mixed in the volume ratio of 16:1:1; and maintained at twenty two degrees Celsius is satisfactory for performing the etch of step 29 in FIG. 5.

In the step 31 a composite view of the array and a somewhat larger drawing of the solar cell cavities formed in the FIG. 5 sequence is shown along with several of the numbers used in the preceding description of the FIG. 5 sequence. The isolated aluminum conductors, which in reality, traverse each of the cells aligned with the cavity shown at step 31 in FIG. 5, are shown along the bottom of the step 31 view.

The step 31 drawing also shows several details of the completed solar cell including the backside current collecting network of the bracket 130 which was generally referred to in connection with the FIG. 1 drawing and which was shown during an earlier stage of the above FIG. 5 sequence of steps. As shown in FIG. 5 the network of bracket 130 from FIG. 1, includes the p+ diffusion regions 532 and 534 which were formed in step 14 and one of which was shown at 132 in FIG. 1. Also included in the FIG. 5 step 31 view are the backside n+ diffusion regions which are indicated at 553, 555, and 557 and which were formed in step 20 of the FIG. 5 sequence.

Disposed adjacent the n+ diffusion regions and in intimate contact therewith are the n+ contact regions 559, 561, and 563. Similarly the p+ contact regions 565 and 567 are disposed adjacent to and in intimate contact with the p+ diffusion regions 534 and 532. Both the n+ and the p+ contact regions are fabricated from the aluminum metal which was deposited in step 26 of the FIG. 5 sequence. The intermeshed comb configuration shown in FIG. 11 herein is etched into this step 26 aluminum drying step 30 of the FIG. 5 sequence.

Figure 5A:
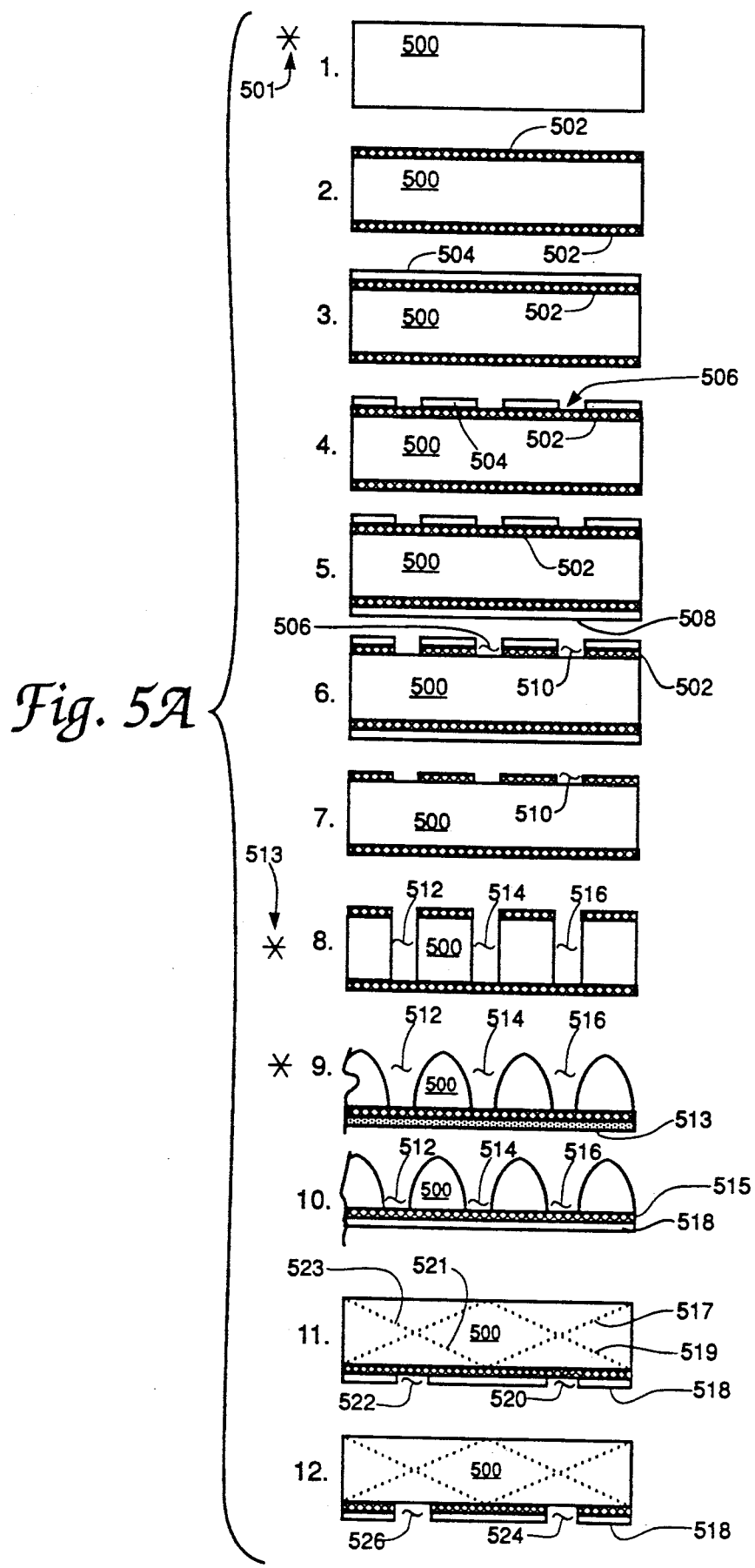
FIGS. 5A-C show a sequence of fabrication steps for achieving a back-contact vertical junction solar cell according to the invention.
Figure 5B:
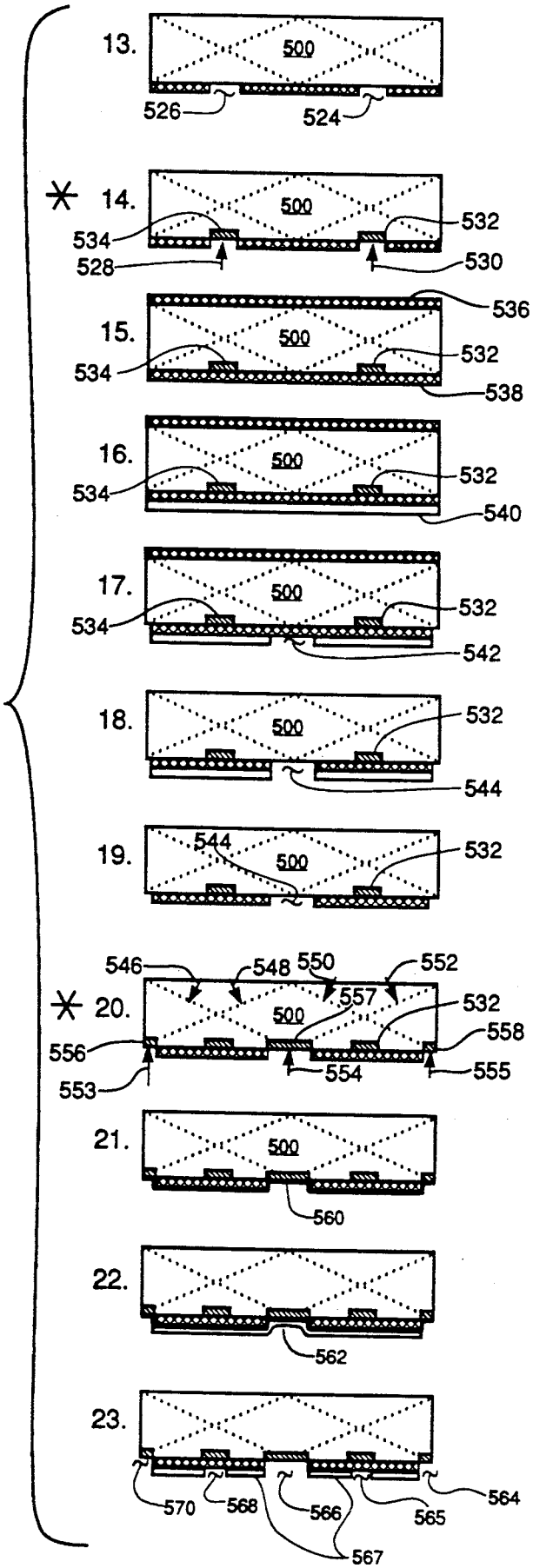
Figure 5C:
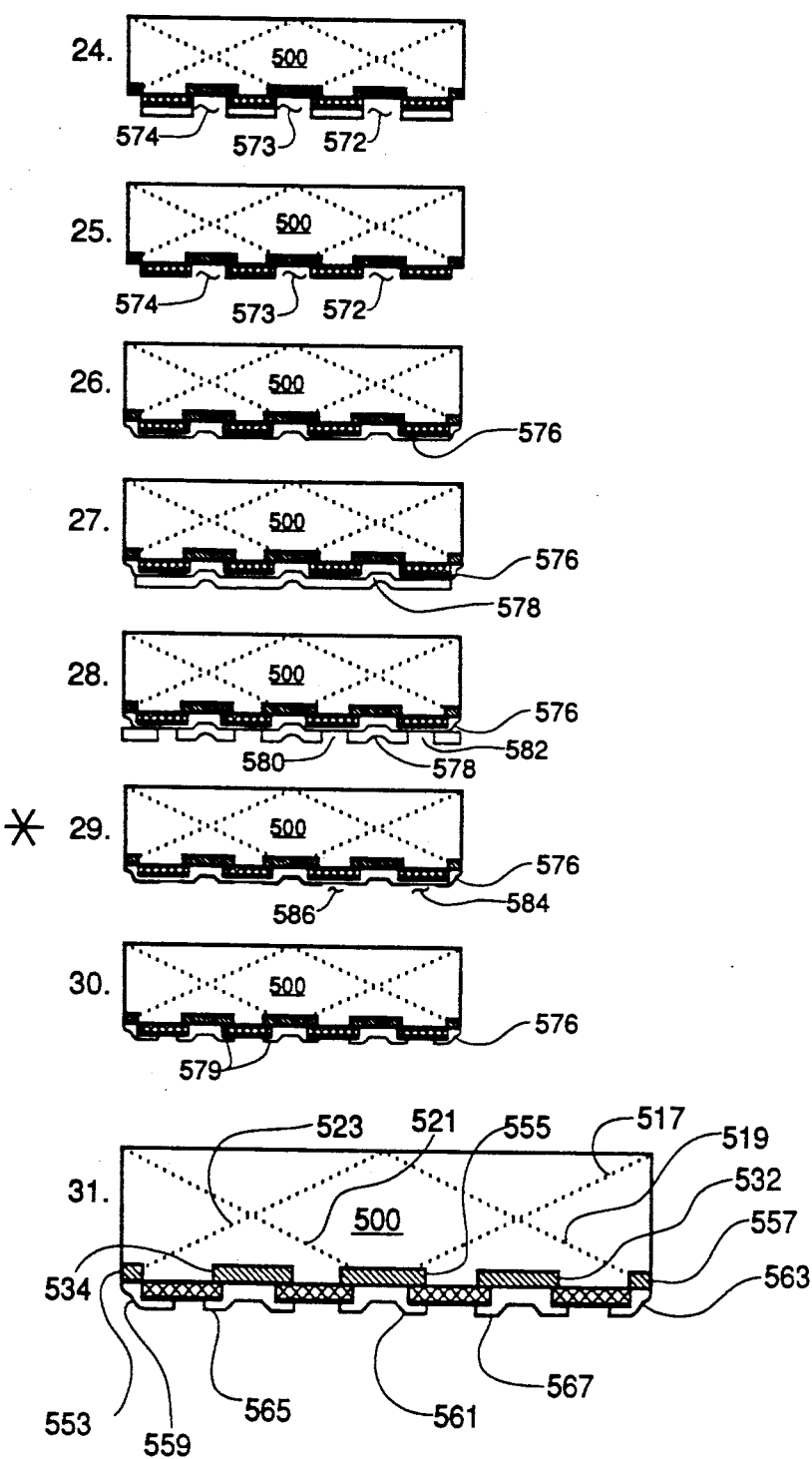
Figure 6:
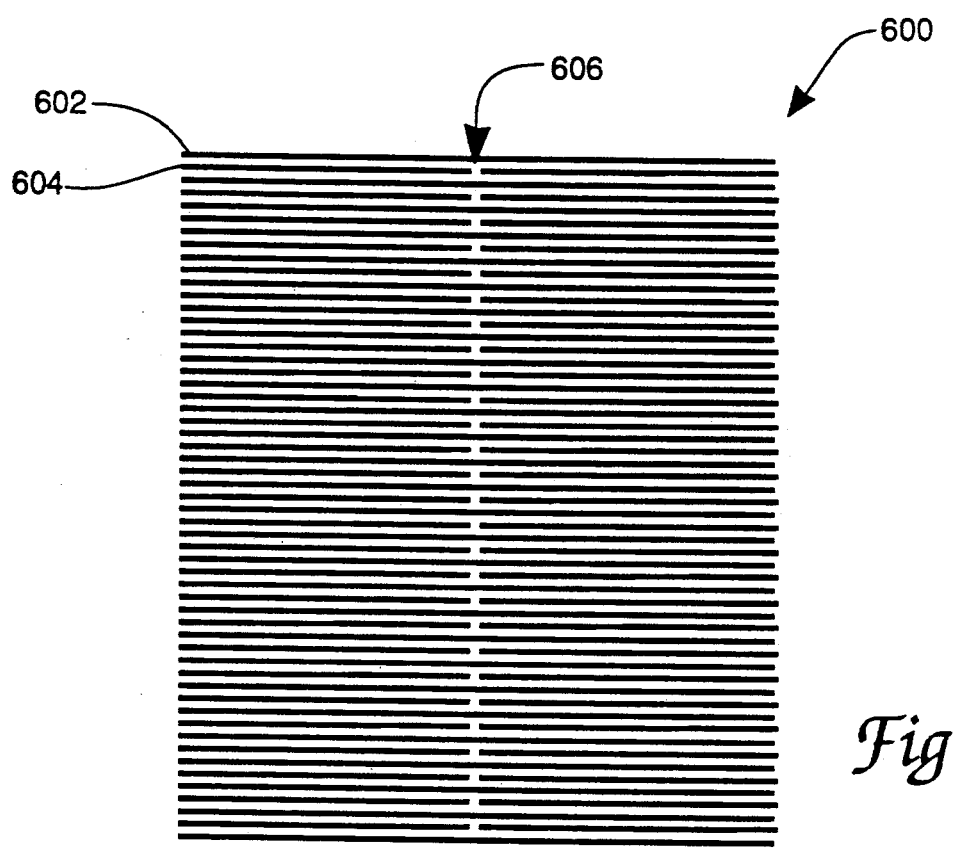
FIG. 6 shows a fundamental pattern usable in generating a photomask for the FIG. 1 solar cell array.

FIG. 6 in the drawing shows the fundamental pattern element used in a step and repeat photolithographic mask generation sequence which ultimately leads to a FIG. 1 type solar cell array. The fundamental pattern of FIG. 6 is, of course, used to generate the photolithographic mask which is used to expose the photoresist coating in step 5 of the FIG. 5 sequence. The fundamental pattern element 600 in FIG. 6 includes a series of cavity central region and valley point forming elements 602 that are interleaved with cavity end region forming elements 604. The end region forming elements 604 include the separation gap segment 606 which ultimately results in the formation of endwise divider sections of the type shown at 147 and 148 in the FIG. 1 drawing. The FIG. 6 fundamental pattern element is moved according to a first pattern sequence to form one solar cell array and according to a second larger pattern sequence to form additional solar cell arrays disposed on the same host wafer. In this first pattern sequence, the FIG. 6 fundamental pattern is moved in a sequence wherein the next adjacent position is located by translating the fundamental cell pattern to align with either a topside or edge of the previous cell. The FIG. 6 pattern may, for example, be stepped-and-repeated to generate a square solar cell measuring 10,160 microns on each edge as described below. In the semiconductor art the term step-and-repeat generally means, of course, to move a fundamental pattern in both the x and y directions so as to generated a larger pattern of the fundamental cell and not destroy its symmetry.

The semiconductor wafer exposing groove mask preferably has a separation between the grooves of 20.4 micrometers. This dimension allows exactly one groove per mil and thereby makes stepping-and-repeating simple because step-and-repeat equipment is often calibrated in mils.

Since the first reduction camera operation can have only a 1 mil (25.4 um) resolution capability, and the groove width chosen is 5 um, a groove mask requires more than one reduction with this equipment. Therefore, a desirable and practical way to achieve a groove mask with the needed resolution is to step-and-repeat a pattern.

The pattern shown in FIG. 6 may be stepped-and-repeated ten times per row with an exposure spacing of 40 mils (1016 um). Each resulting cell contains four rows of the repeated pattern. The rows resulting are spaced 100 mils (2540 um) center-to-center. This procedure produces a continuous pattern of grooves 400 by 400 mils (10,160 um) with each groove dimension being 1000 um long by the 5 um wide. The spacing between grooves is 20.4 um on the sides and 16 um on the ends. The repeated array of grooves forms a laid resembling pattern which may be used in the FIG. 1 solar cell.

Figure 11:
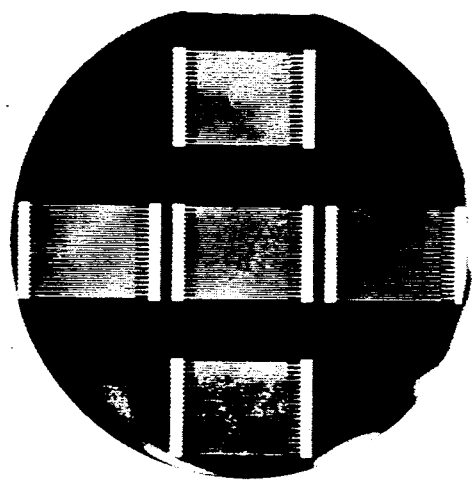
FIG. 11 shows a backside microphotograph of five present invention solar cell arrays disposed on a silicon wafer.

In order to increase the probability of achieving at least one good cell, the groove mask may consist of five square areas of grooves disposed symmetrically over a two inch wafer, for example, as is shown in FIG. 11 herein. Each side is 0.4-inches (1.015 cm) long. Therefore, the area of each cell is 0.16 square inches or 1.032256 cm². A row of grooves 600 mils (15,240 um) long is desirably placed at the bottom of the groove mask to serve as an alignment mark (aligned with wafer flat) for Virginia Semiconductor brand wafers. Also, a vertical line may be placed to one side as an alignment mark for the Ametek brand (Sunnyvale, Calif. 94086) wafers. Ametek wafers have a flat cut perpendicular to the ($1\overline{1}1$) plane; Virginia Semiconductor wafers have the flat cut parallel to the ($1\overline{1}1$) plane.

Figure 7A:
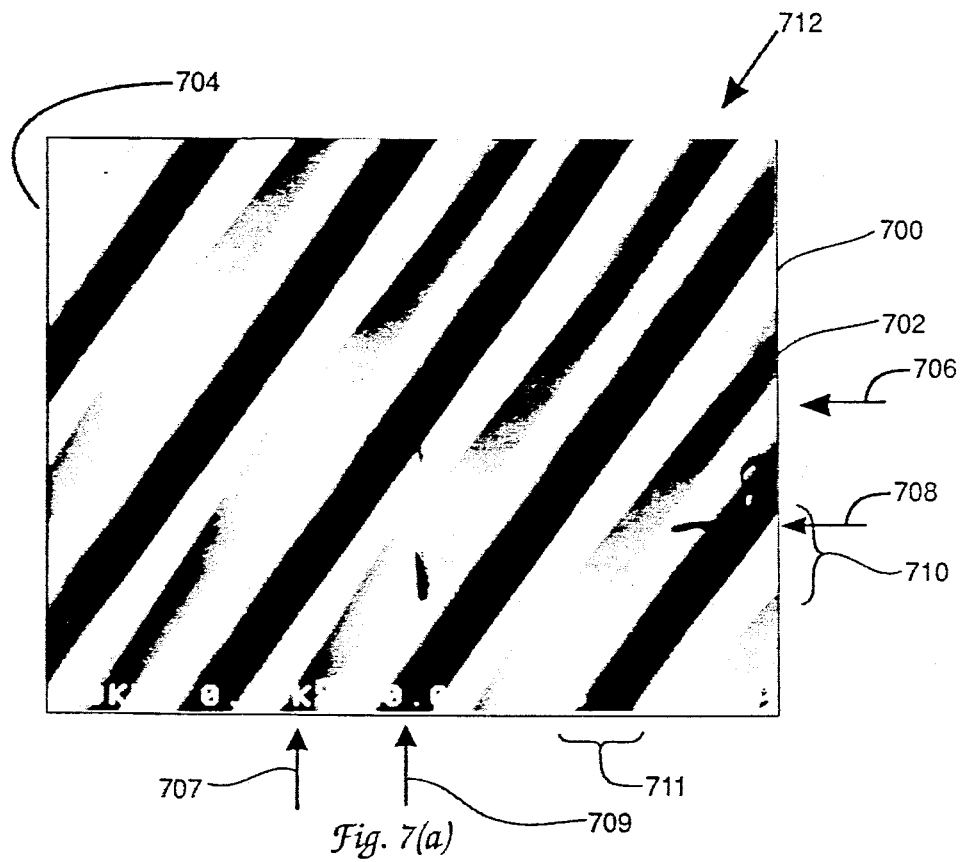
FIGS. 7A-B show two SEM microphotograph views of a solar cell array made in accordance with the invention.
Figure 7B:
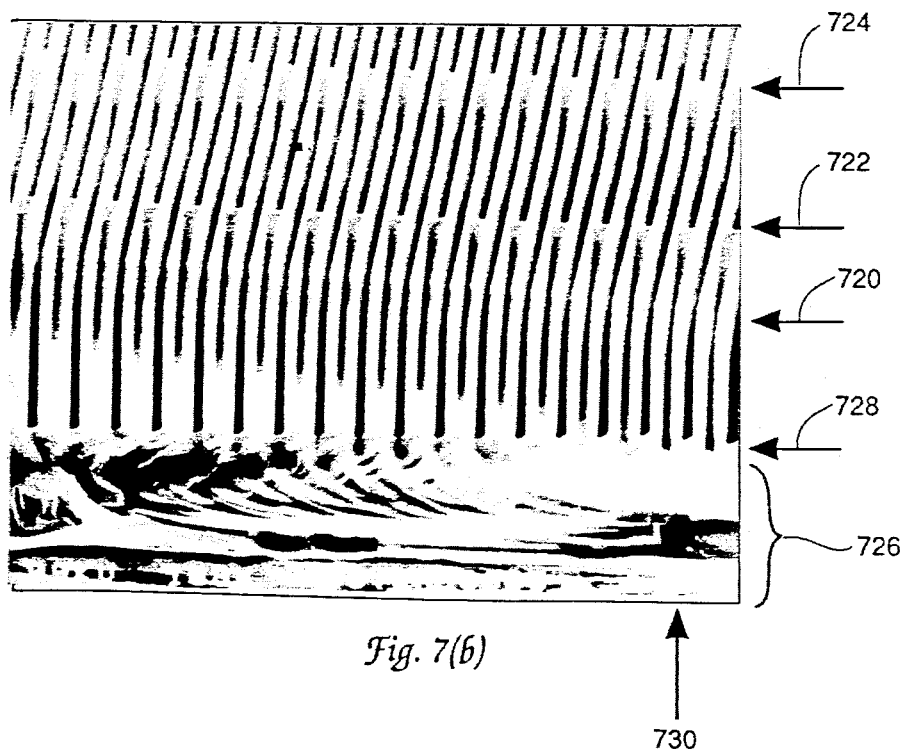

FIG. 7 in the drawings shows two microphotograph SEM images of a solar cell array made in accordance with the invention. In the FIG. 7a portion of FIG. 7 is shown a top surface view of the solar cell array prior to the isotropic pointing etch process. The FIG. 7a magnification is 500 times as is indicated along the lower edge of the microphotograph. In this FIG. 7a view, the light colored stripes as indicated at 700 represent upstanding rib members of the type shown at 144 and 146 in FIG. 1, while the darkened stripes as indicated at 702 represent cavities of the type shown at 105 and 106 in FIG. 1. Also visible in FIG. 7a are the actual shapes of the cavity endwise divider sections and the cavity end regions, that is the region shown in FIG. 4d in the drawings. These shapes are indicated by the arrows 706, 707, 708, and 709 and also at 704 in FIG. 7a. Additionally visible in FIG. 7a is the sloping nature of the cavity bottom surfaces, such surfaces being the darker colored regions of the shadings as shown at 711 and 712, for example.

The FIG. 7a microphotograph is, of course, obtained prior to the isotropic pointing etch of the upstanding rib members and represents the condition of the wafer's surface following step 8 of the fabrication process shown in FIG. 5 of the drawings. Several extraneous marks appear as dark objects in the FIG. 7a microphotograph, These objects which may result from both extraneous material and negative scratches are located in vertical alignment with the arrow 709, for example. These marks are therefore not to be confused with intended features of the solar cell array.

The FIG. 7b portion of FIG. 7 shows a topwise and end cross-sectional view of a solar cell array made in accordance with the invention. The microphotograph of FIG. 7b is a 188 times magnification of a cell array that is fractured along a surface break line 720 skewed with respect to alignment of the cavity endwise divider sections 722 and 724. The cross-sectional shape of the upstanding rib members in the solar cell array is clearly illustrated in the FIG. 7b microphotograph as is the tilted nature of the cavity bottom surfaces. The rounded corner gothic arch shape of the upstanding rib member cross section is shown in alignment with the break line 720 arrow in FIG. 7b, while a good example of the tilted bottom cavity surface is shown for the cavity identified by the arrows 728 and 730. The apparently decreasing depth of the cavities proceeding toward the left in FIG. 7b is, of course, one result of the skewed orientation of the break line 720 with respect to the array features. Also visible in FIG. 7b is the substrate fracture zone 726 for the material lying below the solar cell array structure. Additional microphotographs in the nature of FIG. 7b, but having a greater degree of magnification, are to be found in FIG. 8 of the above incorporated by reference Chemistry of Materials published article.

FIG. 8 in the drawings shows a SEM or microphotograph view of the backside or downward facing side of a solar cell array made in accordance with the invention and following the p+ diffusion of step 14 in the FIG. 5 sequence. In FIG. 8 the darkened narrow stripes 808 are the p+ diffusion regions from step 14 of FIG. 5, while the wider lighter colored stripes at 804 represent non-diffused bands on the wafer's backside. The darkened angularly disposed diamond shaped objects in the vertical columns designated by the arrow 806 represent the vertical-junction valley point slits which appear on the downward facing surface of the solar cell array; that is, the slits indicated by the arrow 322 in FIG. 3. Slits of this type occur at 134 in FIG. 1 and at 414 in FIG. 4. In the FIG. 8 view of these slits the illustrated diamond shape is a result of the secondary effects of processing located between steps 8 and 14 in the FIG. 5 sequence. As indicated in the information designated by the arrow 800, the image in FIG. 8 is magnified 57.3 times.

Figure 9:
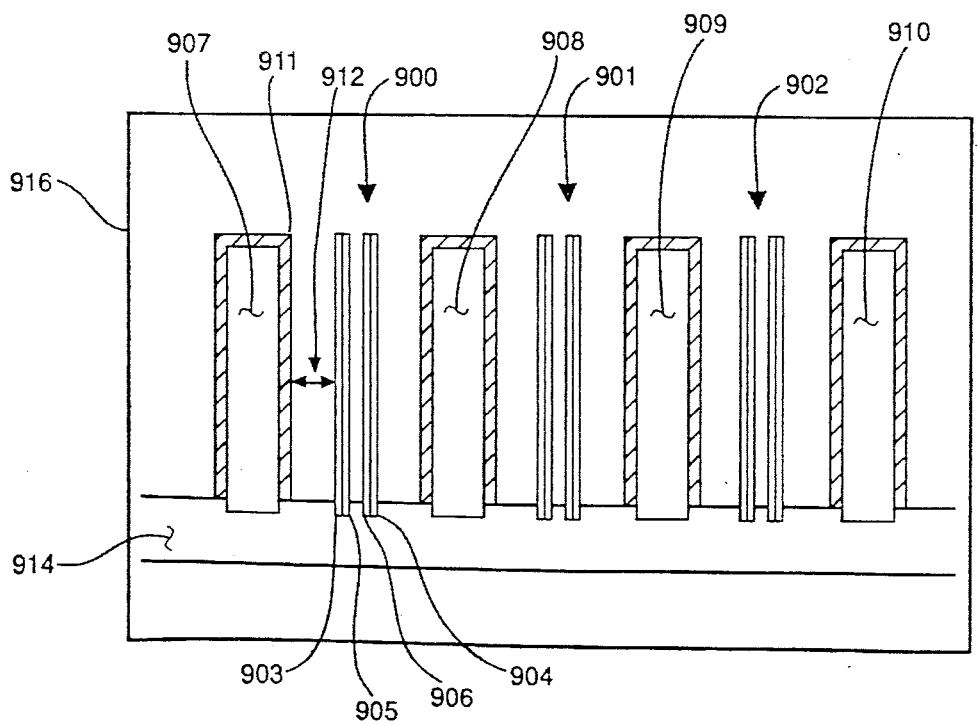
FIG. 9 shows one arrangement for accomplishing the diffusion in a FIG. 1 solar cell.

FIG. 9 in the drawings shows one arrangement by which the p+ diffusion of step 14 in the FIG. 5 sequence may be accomplished. In FIG. 9, three sets of solar cell array containing wafers, indicated at 900, 901, and 902 are disposed in a boron diffusion boat 914 intermediate four dopant wafer sources of boron which are indicated at 907, 908, 909, and 910 in FIG. 9. Each of the groups of wafers 900, 901, and 902, includes two wafers that are to be doped on one surface; these wafers are indicated at 903 and 904 in the group 900. The surface of the wafers that are not to be doped are shielded in FIG. 9 by a pair of dummy wafers 905 and 906 that are disposed on the solar cell groove or solar cell cavity faces of the wafers whose backside is to be doped. By way of the shielding afforded by the dummy wafers 905 and 906, the boron vapor generated during operation of the diffusion enclosure 916 is excluded from the cavity surfaces of the solar cell array wafers. As indicated at 911 in FIG. 9, the boron dopant source wafers 907, 908, 909, and 910 are provided with a vapor of porous ceramic binder which serves to diffuse the solid-to-vapor boron emissions. As is indicated by the dimension 912 in FIG. 9, a separation of about 80 mils is provided between the wafers to be doped 903 and 904 and the adjacent boron dopant source wafers 907 and 908.

Figure 10:
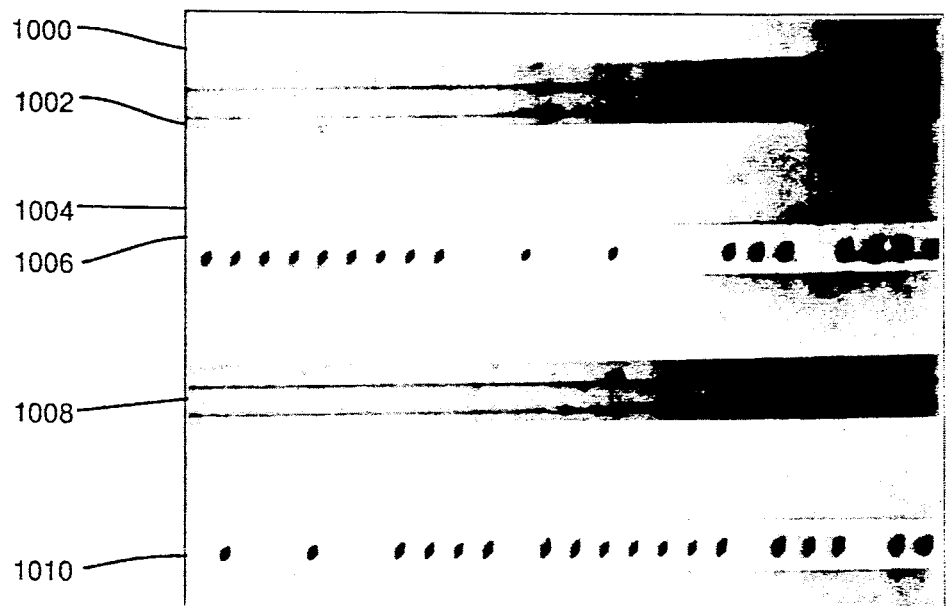
FIG. 10 shows a microphotograph view of a backside portion from a FIG. 1 solar cell.

FIG. 10 in the drawings shows an optical microscope microphotograph of the downward facing surface of a solar cell array according to the invention-after completion of both the n+ diffusion of step 14 and the additional p+ diffusion of step 20 in the FIG. 5 sequence. In the FIG. 10 microphotograph, the dark stripes at 1000 and 1008 are a result of the p+ diffusion while the lighter colored stripes at 1004 and 1010 are a result of the n+ diffusion accomplished in step 20. These diffusions form the array of pn-junction charge collecting regions in the solar cell array. The diamond-shaped cavity valley point to wafer backside intersections described in connection with FIG. 8 above, are shown at 1001 in FIG. 10 and are surrounded by the light stripe material 1006 of the n+ diffusions in FIG. 10. The lightest color of the array backside view in FIG. 10, that is the stripe indicated by the number 1002, is the oxidized silicon substrate material. The degree of enlargement is not shown in the FIG. 10 microphotograph, but it is, however, a ninety times enlargement of the wafer surface. The diffusion lines shown in FIG. 10, that is, the lines 1000, 1008, 1006, and 1010 are preferably made to have a width of four mils, or 101.6 microns, and the metal contact lines which are formed on top of these diffusions are made to have widths of two mils, or 50.8 microns, in order to compensate for possible misalignment error between the diffusion and metal deposition processes. A boron concentration of at least $10^{19}$ atoms per cubic centimeter immediately below the wafer's surface is desirable in order to achieve good ohmic contact and small contact resistance with the p+ diffused regions.

FIG. 11 of the drawings shows a microphotograph of the downward facing surface of a wafer that hosts five solar cell arrays of the type shown in FIG. 1. Visible in the FIG. 11 microphotograph are the patterned metallic conductors disposed on the solar cell array backside in registration with the n+ diffused and p+ diffused charge collecting junctions. The header strips located at opposite ends of the intermeshed comb pattern of the metal conductors are also visible in FIG. 5. The laterally disposed comb pattern conductors in FIG. 11 connect all of the n+ doped regions edge header strips of a particular solar cell and all of the p+ doped cavity backside region to the opposite edge header of the cell. Use of the electrical energy developed in the FIG. 5 solar cells, of course, requires the connection of additional preferably flexible conductors to the oppositely disposed headers in FIG. 11. A magnification of 1.5 times is used in the FIG. 11 microphotograph. Step 29 in the FIG. 5 fabrication sequence provides the individual conductors shown in the FIG. 11 microphotograph from the evaporated aluminum layer resulting from step 26. Each of the headers shown in the FIG. 11 backside view measure approximately 50 mils by 400 mills. The aluminum film of the FIG. 11 conductors preferably has a thickness of about 10,000 angstroms.

ADVANTAGES AND FEATURES

A number of advantages and desirable features are provided by the solar cell structure and fabrication method described herein. Included in these advantages are the following:

1. The disclosed solar cell achieves both a high degree of ionizing radiation hardness and improved power generation efficiency. Contributions to this desirable radiation hardness results from providing a high density of pn-junctions in the array, and locating the junctions deep within the cell structure, for example.

2. The "blackbody" radiant energy absorber provided by the pointed vertical channel walls in the described pn-junction cells contributes to increased energy conversion efficiency. It is notable that this improvement is achieved without the use of anti-reflection coatings.

3. The staggered physical arrangement of cavities in the solar cell array is found to provide a desirable degree of physical robustness and enables use of the array in space or other abusive environments.

4. The described solar cell array achieves desirably low carrier recombination losses through the close and selective placement of carrier collecting pn-junctions on the backside of the array.

5. The use of backside collection pn-junctions and interconnecting conductors decreases the incident light shading encountered when these elements are disposed on the frontward side of the array.

6. In addition to the disclosed use of the herein fabricated cavity structure as a solar cell light to electrical transducer, the disclosed structure may also be useful as a heat dissipating or radiating element for integrated circuits or similar devices. The grooves and "finned" nature of the array's surface and the possible "blackbody" appearance of the structure are each helpful in such an alternate use. Dimensions of the cavities or other features may be altered as desired for optimizing such usage. Heat dissipating use of the described structure is additionally aided by the presence of good thermal conductivity properties of the materials used in the array, conduction comparable with that of aluminum at room temperature. The increasing thermal conductivity with decreasing temperature property found in silicon may enable further refinement of such use especially in critical applications.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. Vertical-junction back contact solar cell apparatus comprising the combination of:

a wafer of semiconductor material having upward and downward facing surfaces and predetermined thickness, first conductivity type dopant, crystal orientation, and concentration;

an array of radiant energy capturing vertical walled and tilted flat bottomed cavity members disposed in rows across said semiconductor wafer upward facing surface with each of said cavities including an internal surface area received layer of pn-junction forming second conductivity type dopant containing semiconductor;

a first grid of electrically interconnected electrodes dispersed across said downward facing wafer surface in surface contact with first electrical polarity current collection regions of each said pn-junction inclusive cavity member;

a second grid of electrically interconnected electrodes electrically segregated from said first grid and dispersed across said downward facing wafer surface in surface contact with second electrical polarity current collection regions of each said pn-junction inclusive cavity member.

2. The solar cell apparatus of claim 1 wherein each said cavity member is comprised of:

first and second substantially parallel disposed upstanding wall members, with the upstanding wall members of endwise adjacent cavity members extending in lengthwise alignment across said upward facing wafer surface as portions of said upward facing surface rows;

first and second divider members located between each cavity and the endwise adjacent cavities and connecting between said upstanding wall members;

said wall members and said divider members being comprised of said semiconductor wafer material.

3. The solar cell apparatus of claim 2 wherein said upstanding cavity wall members include a cross-sectional shape having rounded upper corners and a topmost point of rounding intersection.

4. The solar cell apparatus of claim 3 wherein said wall member cross-sectional shape has the form of a Gothic arch.

5. The solar apparatus of claim 2 wherein each of said cavity members includes a vee-shaped bottom surface portion with the vee-shaped leg surface thereof extending upward from a central valley region toward an upper surface resident portion of said divider members.

6. The solar cell apparatus of claim 5 wherein said vee-shaped leg surface is also tilted from a ninety degree cross-sectional relationship with respect to said upstanding cavity wall members.

7. The solar cell apparatus of claim 6 wherein:

said upward and downward facing wafer surfaces are disposed parallel to the (110) crystal plane of said semiconductor material;

said cavity wall members are disposed perpendicular to the $<1\bar{1}1>$ crystal directions of said semiconductor material;

said first divider members of each cavity include upper surface intersection lines disposed parallel to the line formed from the intersection of (110) and (111) planes in said semiconductor material and said second divider members of each cavity include upper surface intersection lines disposed perpendicular to the $<1\bar{1}1>$ direction of said semiconductor material;

said cavity vee shaped leg surfaces are disposed parallel respectively to the (111) and the $(1\bar{1}1)$ crystal planes of said semiconductor material.

8. The solar cell apparatus of claim 5 wherein said bottom surface portion central valley is disposed proximate said wafer downward facing surface and includes an aperture of predetermined physical size traversing said downward facing surface.

9. The solar cell of claim 5 wherein said bottom surface portion vee-shaped leg surface includes diffused impurity semiconductor pn-junction regions disposed thereover.

10. The solar cell of claim 5 wherein said vee-shaped leg surface and said upstanding wall members include diffused impurity semiconductor junction regions disposed thereover.

11. The solar cell apparatus of claim 2 wherein the length, L, the depth d, and the width, W, of said cavity are related by the mathematical expression:

$L = 2d(3)^{\frac{1}{2}} - W/2^{\frac{1}{2}}$

12. The solar cell of claim 2 wherein said first and second electrical polarity current collection regions include diffused impurity semiconductor junctions.

13. The solar cell of claim 12 wherein said current collection diffused impurity semiconductor junction regions are disposed adjacent said wafer downward facing surface and are each covered with conducting metal.

14. The solar cell apparatus of claim 1 wherein said upward and downward facing wafer surfaces are disposed parallel to the (110) crystal plane of said semiconductor material.

15. The solar cell apparatus of claim 1 wherein said wafer of semiconductor material is homogeneously doped with boron to a bulk resistivity of between one and three ohm-centimeters.

16. The solar cell of claim 1 wherein said first and second grids of electrically interconnected electrodes are comprised of metallic conductors.

17. The solar cell of claim 1 wherein:

said semiconductor wafer is comprised of single crystalline silicon with said upward and downward facing surfaces being parallel to the (110) crystal plane thereof:

said cavities each include a vee-shaped bottom surface with the valley portion thereof residing adjacent said downward facing wafer surface and including a slit aperture portion disposed in said downward facing wafer surface; and said cavities have a maximum depth, d, which is equal to the thickness of said wafer, a width W, and an length L, which are related to said depth, d, by a predetermined crystal plane orientation determined mathematical relationship.

18. The method for fabricating a vertical-junction back-contact solar cell in the topside surface of a p-doped planar silicon wafer having polished topside and backside surfaces, comprising the steps of:

etching parallel aligned topside received radiant energy reception vertical walled vee legged cavities having flat bottomed tilted vee leg surfaces into said wafer, said wafer being of predetermined thickness, crystal orientation and resistivity, and with said etching being crystallographic orientation dependent and anisotropic in nature;

diffusing additional p+ impurities into cavity registered wafer backside current collection junction locations;

diffusing n+ impurities into cavity registered and p+ impurity junction segregated wafer backside current collection junction locations and into cavity surface areas of the wafer topside received cavities;

covering the p+ diffused wafer backside current collection junction locations with a first wafer surface disposed interconnected array of metallic conductors;

covering the n+ diffused wafer backside current collection junction locations with a second wafer surface disposed interconnected array of metal conductors which are electrically isolated from said first array conductors.

19. The method of claim 18 further including the step of rounding the wafer topside surface to cavity wall surface corner edges of said cavities into a light capturing Gothic arch cross sectioned curvature, said corner rounding including an isotropic etching step.

20. The method of claim 18 wherein:

said wafer planar surfaces are disposed parallel to the (110) crystal plane of said silicon material;

said cavity etching step includes etching in the direction perpendicular to said (110) crystal plane until a cavity connected aperture in the wafer backside surface is obtained.

21. The method of claim 18 further including the preliminary step of removing silicon material from the surfaces of said wafer until a wafer of predetermined uniform thickness remains.

22. The method of claim 21 wherein said removing step comprises a combination of oxidizing and isotropic chemical polish etching.

23. The method of claim 18 wherein:

said wafer surface is disposed parallel to the (110) crystal plane of said wafer silicon material;

said cavities are of a substantially triangularpiped lengthwise cross section with the elongated triangular sloped wall surface thereof being disposed perpendicular to the $<1\bar{1}1>$ crystal direction of said wafer silicon material, and the sloping bottom surfaces of said cavity are disposed parallel to the (111) and ($1\bar{1}1$) crystal planes of said semiconductor material.

24. The method of forming a cavity of substantially rectangular plane and symmetrically-sloped bottom surfaces in the upward facing surface and body of a planar semiconductor wafer comprising the step of:

selecting a planar specimen of (110)-oriented semiconductor material for hosting said cavity;

adjusting the thickness of said semiconductor wafer to a dimension relating to the direction length and direction width of said cavity on said upward facing wafer surface according to a predetermined mathematical relationship;

generating oxide masking of predetermined etch resisting thickness and a cavity plane shape and dimensions on said upward facing and (110) plane parallel wafer surface;

applying an etchant of anisotropic <110> vertical etch direction preferring characteristic to said masked upward facing wafer surface;

continuing the etching of said semiconductor material in the vertical <110> direction, including an attending etch exposing of symmetrical (111) and ($1\bar{1}1$) sloping and intersecting surfaces, until the regressing valley intersection of said (111) and ($1\bar{1}1$) surfaces reaches the backside surface of said wafer, opens a slit aperture therein, and commences a slower nonpreferred rate of etch regressing;

terminating said etching after commencement of said slower nonpreferred rate of etch regressing.

25. The method of claim 24 wherein said semiconductor material is silicon.

26. The method of claim 25 wherein said (111) and ($1\bar{1}1$) plane sloping bottom surfaces are both sloped with respect to the top surface of the oriented planar solar cell surface at an angle of 30°.

27. The method of claim 26 wherein said cavity substantially rectangular plane shape includes cavity endwise disposed first and second cavity divider lines which are nonorthogonally oriented with respect to the cavity lengthwise extending sidewall lines on said wafer upward facing surface.

28. The method of claim 27 wherein said first divider lines include upper surface intersection lines disposed parallel to the line formed at the intersection of (110) and (111) planes in said semiconductor material and said second divider lines include upper surface intersection lines disposed perpendicular to the $<1\bar{1}1>$ direction of said semiconductor material.

29. The method of claim 25 wherein said anisotropic etchant includes potassium hydroxide.

30. The method of claim 29 wherein said step of generating oxide masking includes a step and repeat sequence wherein a plurality of endwise and sidewise adjacent of said cavities are disposed across said wafer upward facing surface in a grooved surface pattern.

31. The method of claim 25 wherein said cavity length, L, and width, W, to wafer thickness, d, predetermined relationship is defined by the mathematical expression:

$$L = 2(d)(3)^{\frac{1}{2}} - w/2^{178}$$

32. The method of claim 24 wherein said thickness adjusting step includes a polishing etch with an etchant comprising mixed hydrofluoric acid, nitric acid, and acetric acid.

* * * * *

UNITED STATES PATENT AND TRADEMARK OFFICE
CERTIFICATE OF CORRECTION

PATENT NO. : 5,067,985
DATED : November 26, 1991
INVENTOR(S) : Michael W. Carver et al It is certified that error appears in the above-identified patent and that said Letters Patent is hereby corrected as shown below:

```
Col 4, line 23, a dash should follow "cavities".
Col 4, line 32, "cell" should read --cells--.
Col 5, line 18, the second "of" should be --on--.
Col 5, line 62, delete the second comma after "124".

Col 11, line 38, add --in the three views or sheets or
      parts which are identified as FIG. 5A, FIG. 5B, and
      FIG. 5C-- after "steps".
Col 11, line 51, --FIG. 5A-- should follow "the".
Col 13, line 23, a space should precede "planes".
Col 13, line 24, a space should precede "planes".
Col 13, line 30, "to" should read --top--.
Col 13, line 38, "nitro" should read --nitric--.
```

Signed and Sealed this

Eleventh Day of May, 1993

Attest:

MICHAEL K. KIRK

Attesting Officer        Acting Commissioner of Patents and Trademarks